(12) United States Patent
Storm et al.

(10) Patent No.: US 12,476,075 B2
(45) Date of Patent: Nov. 18, 2025

(54) STACK ALIGNMENT TECHNIQUES

(71) Applicant: ASML Netherlands B.V., Veldhoven (NL)

(72) Inventors: Arjen Benjamin Storm, Delft (NL); Johan Frederik Cornelis Van Gurp, Berkel en Rodenrijs (NL); Johannes Cornelis Jacobus De Langen, Delft (NL); Aaron Yang-Fay Ayal, Roosendaal (NL); Michiel Matthieu Bruinink, Rijswijk (NL); Christiaan Ruben Van Den Berg, 's-Gravenzande (NL); Christiaan Otten, IJsselstein (NL); Laura Dinu Gurtler, Delft (NL); Marc Smits, Pijnacker (NL)

(73) Assignee: ASML Netherlands B.V., Veldhoven (NL)

( * ) Notice: Subject to any disclaimer, the term of this patent is extended or adjusted under 35 U.S.C. 154(b) by 397 days.

(21) Appl. No.: 17/952,115

(22) Filed: Sep. 23, 2022

(65) Prior Publication Data
US 2023/0020745 A1    Jan. 19, 2023

Related U.S. Application Data

(63) Continuation of application No. PCT/EP2021/056519, filed on Mar. 15, 2021.

(30) Foreign Application Priority Data

Mar. 24, 2020 (EP) .................................... 20165332

(51) Int. Cl.
*H01J 37/153* (2006.01)
*G03F 9/00* (2006.01)
(Continued)

(52) U.S. Cl.
CPC ........ *H01J 37/3177* (2013.01); *G03F 9/7003* (2013.01); *H01J 37/09* (2013.01);
(Continued)

(58) Field of Classification Search
CPC .. H01J 37/09; H01J 37/20; H01J 37/28; H01J 37/153; H01J 37/3177; H01J 2237/2817; H01J 2237/24592; G03F 9/7003
See application file for complete search history.

(56) References Cited

U.S. PATENT DOCUMENTS 6,925,860 B1    8/2005 Poris et al.
2002/0028532 A1    3/2002 Tsunashima
(Continued)

FOREIGN PATENT DOCUMENTS

CN    105765689 A    7/2016
CN    109917621 A    6/2019
(Continued)

*Primary Examiner* — Sean M Luck
(74) *Attorney, Agent, or Firm* — FINNEGAN, HENDERSON, FARABOW, GARRETT & DUNNER LLP

(57) ABSTRACT

Disclosed herein is a substrate stack comprising a plurality of substrates, wherein: each substrate in the substrate stack comprises at least one alignment opening set; the at least one alignment opening set in each substrate is aligned for a light beam to pass through corresponding alignment openings in each substrate; and each substrate comprises at least one alignment opening that has a smaller diameter than the corresponding alignment openings in the other substrates.

20 Claims, 6 Drawing Sheets

(51) Int. Cl.
*H01J 37/09* (2006.01)
*H01J 37/20* (2006.01)
*H01J 37/28* (2006.01)
*H01J 37/317* (2006.01)

(52) U.S. Cl.
CPC ............ *H01J 37/153* (2013.01); *H01J 37/20* (2013.01); *H01J 37/28* (2013.01); *H01J 2237/24592* (2013.01); *H01J 2237/2817* (2013.01)

(56) References Cited

U.S. PATENT DOCUMENTS

| | | |
|---|---|---|
| 2008/0259121 A1 | 10/2008 | Stevenson |
| 2012/0267802 A1* | 10/2012 | De Boer ............... G03F 9/7088 257/E23.179 |
| 2015/0178956 A1 | 6/2015 | Davis et al. |
| 2016/0334712 A1 | 11/2016 | Cekli et al. |
| 2019/0180972 A1 | 6/2019 | Lee et al. |

FOREIGN PATENT DOCUMENTS

| | | |
|---|---|---|
| EP | 1985452 A2 | 10/2008 |
| EP | 1985452 A3 | 8/2009 |
| KR | 20080095195 A | 10/2008 |
| KR | 20190069931 A | 6/2019 |
| WO | WO 2021/190976 A1 | 9/2021 |

* cited by examiner

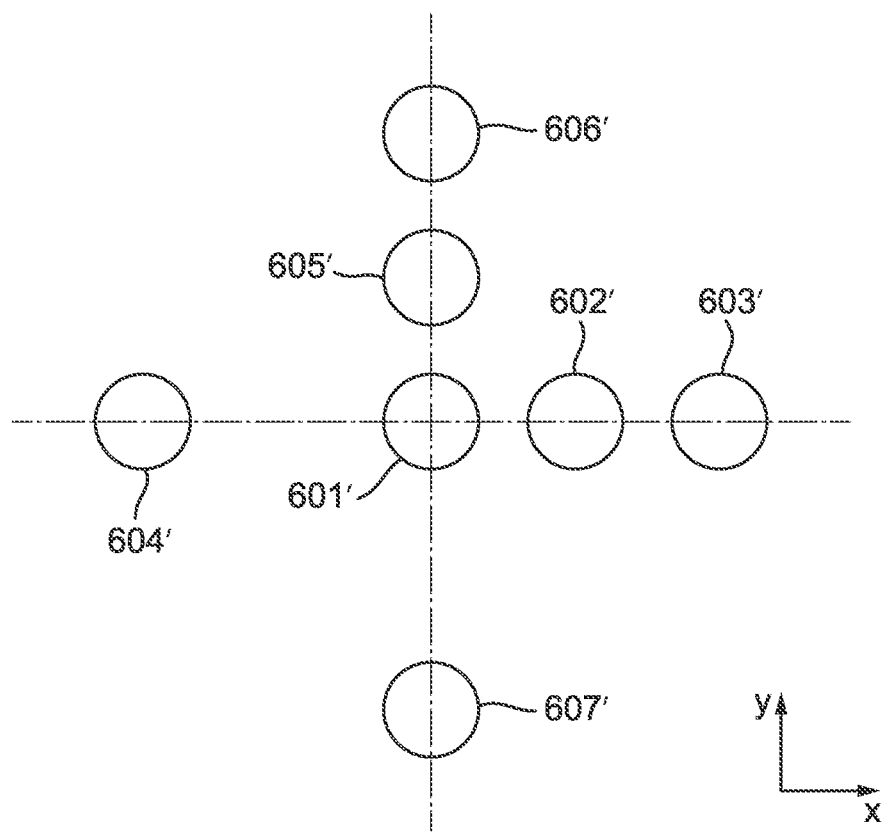

STACK ALIGNMENT TECHNIQUES

CROSS-REFERENCE TO RELATED APPLICATIONS

This application claims priority of International application PCT/EP2021/056519, which was filed on 15 Mar. 2021, which claims priority of EP application 20165332.6, which was filed on 24 Mar. 2020, all of which are incorporated herein by reference in their entireties.

FIELD

The embodiments provided herein generally relate to techniques that may be used to determine the alignment of substrates in a stack of substrates. Embodiments are particularly appropriate in the manufacture and/or testing of a device for the manipulation of sub-beams of charged particles in a multi-beam charged particle apparatus.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an import process during and/or after its manufacture.

Pattern inspection tools with a charged particle beam have been used to inspect objects, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause electrons to be emitted from the surface, such as secondary electrons, backscattered electrons or Auger electrons. The generated secondary electrons may be emitted from the material structure of the sample. By scanning the primary electron beam as the probing spot over the sample surface, secondary electrons can be emitted across the surface of the sample. By collecting these emitted secondary electrons from the sample surface, a pattern inspection tool may obtain an image representing characteristics of the material structure of the surface of the sample.

Another application for a charged particle beam is lithography. The charged particle beam reacts with a resist layer on the surface of a substrate. A desired pattern in the resist can be created by controlling the locations on the resist layer that the charged particle beam is directed towards.

A charged particle apparatus may be an apparatus for generating, illuminating, projecting and/or detecting one or more beams of charged particles. Within a charged particle apparatus, a number of devices are provided for manipulating one or more beams of charged particles. Each device may comprise a stack of substrates. There is a general need to improve the manufacturing and testing of devices that comprise a stack of substrates.

SUMMARY

The embodiments provided herein disclose techniques for determining the relative alignment of substrates in a stack. Embodiments also include determining the relative alignments of a stack of substrate and a PCB support of the stack.

According to some embodiments of the present disclosure, there is provided a substrate stack comprising a plurality of substrates, wherein: each substrate in the substrate stack comprises at least one alignment opening set; the at least one alignment opening set in each substrate is aligned for a light beam to pass through corresponding alignment openings in each substrate; and each substrate comprises at least one alignment opening that has a smaller diameter than the corresponding alignment openings in the other substrates.

According to some embodiments of the present disclosure, there is provided a method for determining the alignment of substrates in a substrate stack that comprises a plurality of substrates, the method comprising: determining the positions of a plurality of light beams that have passed through a respective plurality of alignment openings defined in each substrate in the substrate stack; and determining the relative x, y, and Rz alignments of at least two substrates in the substrate stack in dependence on the determined positions; wherein: for each light beam path through the substrate stack, the alignment opening of one of the substrates on the light beam path has a smaller diameter than all of one or more other alignment openings of respective one or more other substrates on the light beam path; and for each one of at least two of the plurality of light beam paths, a different one of the substrates on the light beam path has an alignment opening with a smaller diameter than all of one or more other alignment openings of respective one or more other substrates on the light beam path such that, for each one of at least two substrates in the substrate stack, there are one or more light beams paths with positions that are indicative of the position of only said one substrate.

According to some embodiments of the present disclosure, there is provided a computing system configured to determine the alignment of substrates in a substrate stack by performing the method according to the second aspect.

According to some embodiments of the present disclosure, there is provided a tool for obtaining data indicative of light beam locations, the tool comprising: a stack holder configured to hold a substrate stack according to the first aspect; an illuminator configured to illuminate at least part of a surface of the substrate stack; and a light detector configured to generate data indicative of the light beam locations in dependence on a plurality of light beams that have passed through the substrate stack.

According to some embodiments of the present disclosure, there is provided a system comprising the tool according to the fourth aspect and the computing system according to the third aspect.

According to some embodiments of the present disclosure, there is provided a method for determining the alignment of substrates in a substrate stack, the substrate stack having at least two substrates, wherein in each of the substrates there are a plurality of alignment openings that align with corresponding alignment openings in the other substrates of the substrate stack such that there is a through passage through the substrate stack associated with each alignment opening in each substrate, the method comprising: determining the relative positions of a plurality of light beams, each light beam having passed along a light path through the substrate stack via a respective through passage; and determining the relative x, y, and Rz alignments of the substrates in the substrate stack in dependence on the determined positions; wherein: the alignment opening of one of the substrates that defines the through passage for a corresponding light path through the through passage has a smaller diameter than the other alignment openings that define the through passage; and for each light path a different substrate in the substrate stack has an diameter with a smaller diameter than the other alignment openings that define the corresponding through passage in the substrate stack.

According to some embodiments of the present disclosure, there is provided a substrate stack of substrates comprising beam manipulators, the substrate stack having at least two substrates, wherein in each substrate there are a plurality of alignment openings that align with corresponding alignment openings in the other substrates of the substrate stack such that there is a through passage through the substrate stack associated with each alignment opening in each substrate, wherein each of the plurality of through passages is for the passage of a light beam and the light beams are suitable for determining the relative x, y, and Rz alignments of the substrates in the substrate stack; wherein: the alignment opening of one of the substrates, that defines the through passage for a corresponding light path through the through passage, has a smaller diameter than the other alignment openings that define the through passage; and a different substrate in the substrate stack has an alignment opening with a smaller diameter than the other alignment openings that define the corresponding through passage in the substrate stack.

According to some embodiments of the present disclosure, there is provided a combination of a printed circuit board, PCB, and the substrate stack mentioned above, the substrate stack being provided on the PCB, wherein: in the PCB is defined an opening configured to be aligned with the through passage in the substrate stack for interacting with a stack light source; and a surface of the PCB comprises a plurality of alignment structures configured to interact with a PCB light source.

According to some embodiments of the present disclosure, there is provided a combination of a printed circuit board, PCB, and substrate stack in which is defined a plurality of through passages for beam path openings, the substrate stack being provided on the PCB, wherein in a surface of the PCB is a plurality of alignment structures configured to interact with a light source for enabling the alignment of the PCB to be determined.

According to some embodiments of the present disclosure, there is provided a method for determining the relative alignments of a substrate stack and a printed circuit board, PCB, wherein the substrate stack is provided on the PCB, the method comprising: determining the positions of a first plurality of light beams that have passed through both a respective plurality of openings through the substrate stack and at least one opening in the PCB; determining the positions of a second plurality of light beams that are dependent on a plurality of PCB alignment structures; and determining the relative x, y, and Rz alignments of the substrate stack and the PCB in dependence on the determined positions of the first and second plurality of light beams.

According to some embodiments of the present disclosure, there is provided a computing system configured to determine the alignment of a PCB and a substrate stack by performing the method according to the tenth aspect.

Other advantages will become apparent from the following description taken in conjunction with the accompanying drawings wherein are set forth, by way of illustration, certain examples.

BRIEF DESCRIPTION OF FIGURES

The above and other aspects of the present disclosure will become more apparent from the description of exemplary embodiments, taken in conjunction with the accompanying drawings.

FIGS. 6A and 6B show configurations of alignment opening sets according to some embodiments.

DESCRIPTION OF EMBODIMENTS

Figure 1:
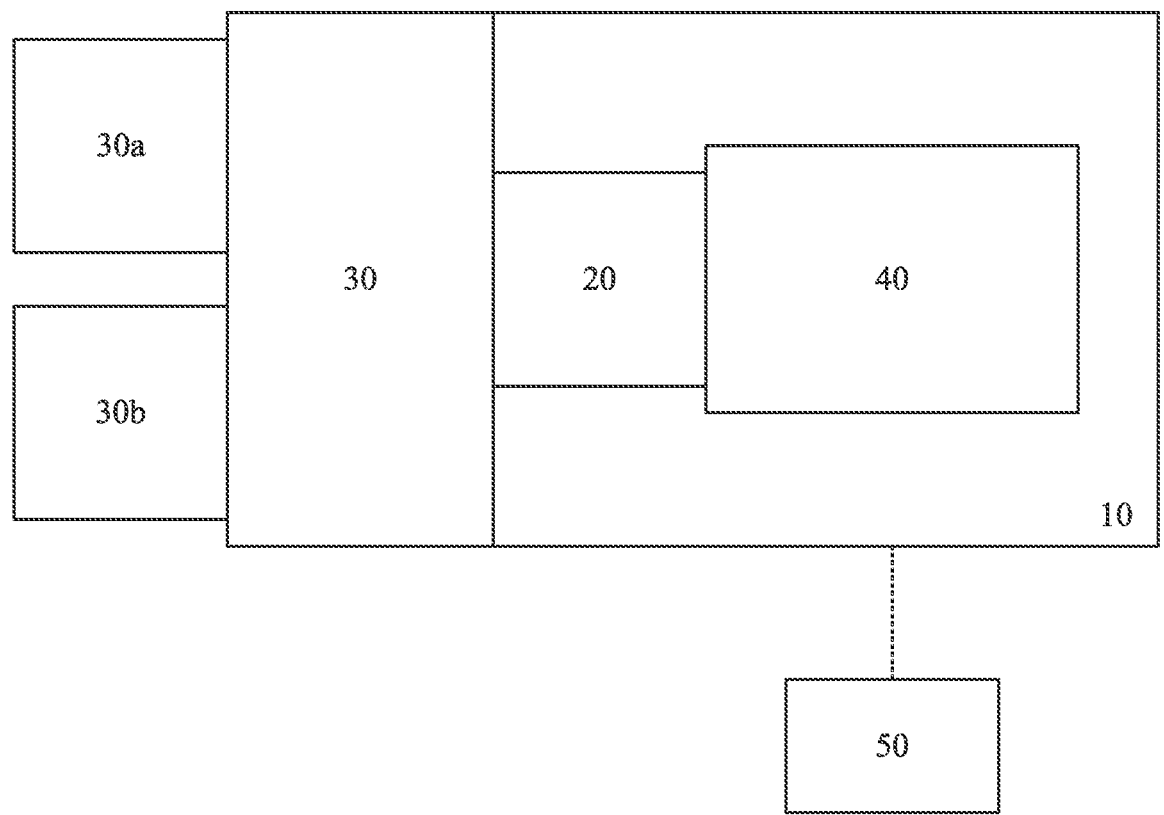
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the technology as recited in the appended claims.

The reduction of the physical size of devices, and enhancement of the computing power of electronic devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $\frac{1}{1000}$th of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If an individual step has a yield of 95%, the overall process yield would be as low as 7-8%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially if operator intervention is required for reviewing the defects. Thus, high throughput detection and identification of micro and nano-scale defects by inspection tools (such as a Scanning Electron Microscope (SEW)) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

In a multi-beam inspection apparatus, the paths of some of the primary electron beams are displaced away from the central axis, i.e. a mid-point of the primary electron optical axis, of the scanning device. To ensure all the electron beams arrive at the sample surface with substantially the same angle of incidence, and/or with a desired pitch and/or at a desired locations on the sample surface, sub-beam paths with a greater radial distance from the central axis need to be manipulated to move through a greater angle than the sub-beam paths with paths closer to the central axis. This stronger manipulation may cause aberrations which result in blurry and out-of-focus images of the sample substrate. In particular, for sub-beam paths that are not on the central axis, the aberrations in the sub-beams may increase with the radial displacement from the central axis because the manipulators of these sub-beam paths are required to operate at larger voltages. Such aberrations may remain associated with the secondary electrons when they are detected. Such aberrations therefore degrade the quality of images that are created during inspection.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be more generally be considered to be references to charged particles, with the charged particles not necessarily being electrons.

Reference is now made to FIG. 1, which is a schematic diagram illustrating an exemplary charged particle beam inspection apparatus 100. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30a and a second loading port 30b. EFEM 30 may include additional loading port(s). First loading port 30a and second loading port 30b may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas molecules in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas molecules in main chamber 10 so that the pressure around the sample reaches a second pressure lower than the first pressure. After reaching the second pressure, the sample is transported to the electron beam tool by which it may be inspected. An electron beam tool 40 may comprise either a single beam or a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, which operate under the second pressure.

Figure 2:
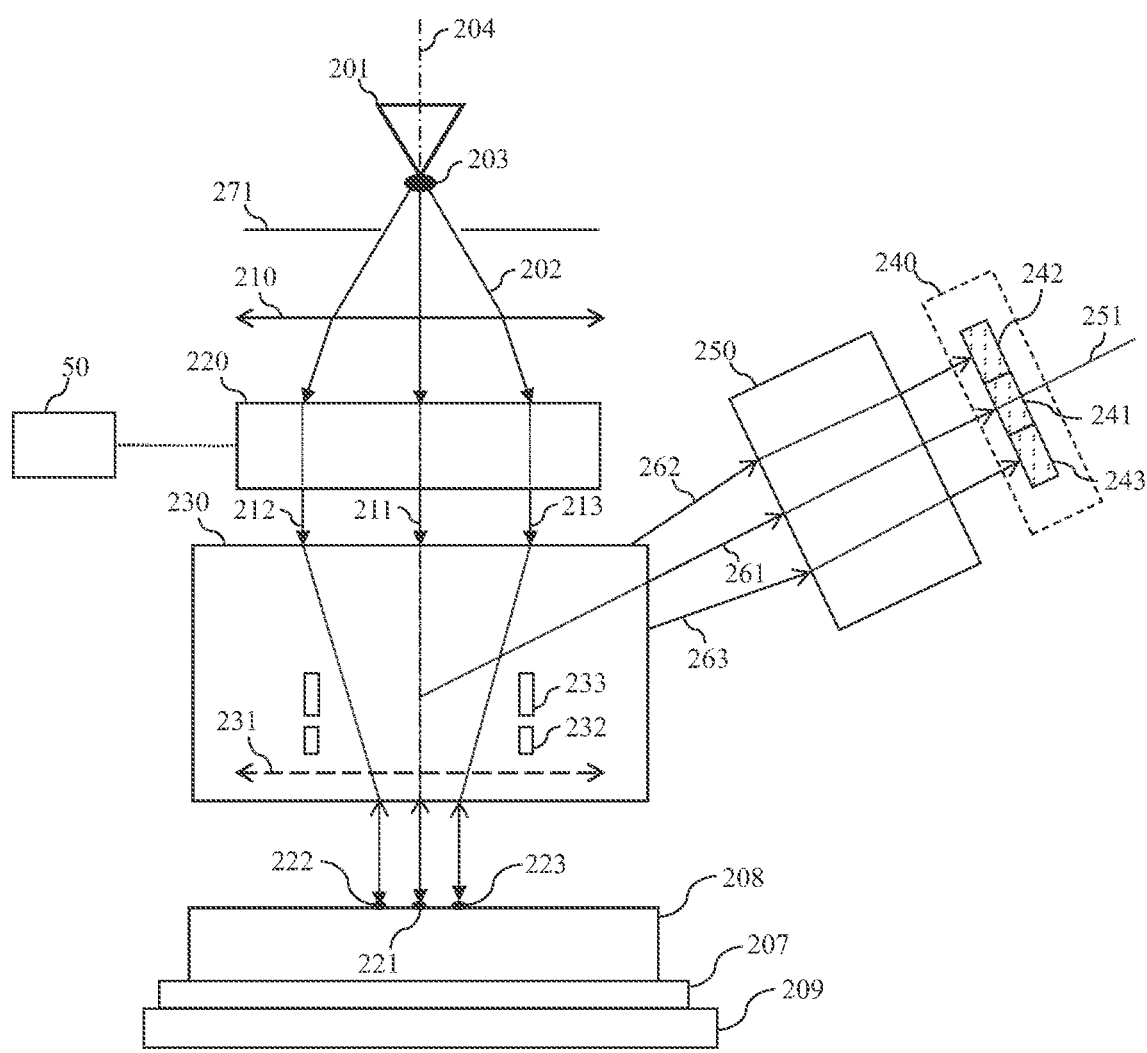
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a gun aperture plate 271, a condenser lens 210, a source conversion unit 220, a primary projection apparatus 230, a motorized stage 209, and a sample holder 207. The electron source 201, a gun aperture plate 271, a condenser lens 210, a source conversion unit 220 are the components of an illumination apparatus comprised by the multi-beam electron beam tool 40. The sample holder 207 is supported by motorized stage 209 so as to hold a sample 208 (e.g., a substrate or a mask) for inspection. Multi-beam electron beam tool 40 may further comprise a secondary projection apparatus 250 and an associated electron detection device 240. Primary projection apparatus 230 may comprise an objective lens 231. Electron detection device 240 may comprise a plurality of detection elements 241, 242, and 243. A beam separator 233 and a deflection scanning unit 232 may be positioned inside primary projection apparatus 230.

The components that are used to generate a primary beam may be aligned with a primary electron-optical axis of the apparatus 40. These components can include: the electron source 201, gun aperture plate 271, condenser lens 210, source conversion unit 220, beam separator 233, deflection scanning unit 232, and primary projection apparatus 230. Secondary projection apparatus 250 and its associated electron detection device 240 may be aligned with a secondary electron-optical axis 251 of apparatus 40.

The primary electron-optical axis 204 is comprised by the electron-optical axis of the of the part of electron beam tool 40 that is the illumination apparatus. The secondary electron-optical axis 251 is the electron-optical axis of the of the part of electron beam tool 40 that is a detection apparatus. The primary electron-optical axis 204 may also be referred to herein as the primary optical axis (to aid ease of reference) or charged particle optical axis. The secondary electron-optical axis 251 may also be referred to herein as the secondary optical axis or the secondary charged particle optical axis.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202 that forms a primary beam crossover (virtual or real) 203. Primary electron beam 202 may be visualized as being emitted from primary beam crossover 203.

In this arrangement a primary electron beam, by the time it reaches the sample, and preferably before it reaches the projection apparatus, is a multi-beam. Such a multi-beam can be generated from the primary electron beam in a number of different ways. For example, the multi-beam may be generated by a multi-beam array located before the cross-over, a multi-beam array located in the source conversion unit 220, or a multi-beam array located at any point in between these locations. A multi-beam array may comprise a plurality of electron beam manipulating elements arranged in an array across the beam path. Each manipulating element may influence the primary electron beam to generate a sub-beam. Thus the multi-beam array interacts with an incident primary beam path to generate a multi-beam path down-beam of the multi-beam array.

Gun aperture plate 271, in operation, is configured to block off peripheral electrons of primary electron beam 202 to reduce Coulomb effect. The Coulomb effect may enlarge the size of each of probe spots 221, 222, and 223 of primary sub-beams 211, 212, 213, and therefore deteriorate inspection resolution. A gun aperture plate 271 may also be referred to as a coulomb aperture array.

Condenser lens 210 is configured to focus primary electron beam 202. Condenser lens 210 may be designed to focus primary electron beam 202 to become a parallel beam and be normally incident onto source conversion unit 220. Condenser lens 210 may be a movable condenser lens that may be configured so that the position of its first principal plane is movable. The movable condenser lens may be configured to be magnetic. Condenser lens 210 may be an anti-rotation condenser lens and/or it may be movable.

Source conversion unit 220 may comprise an image-forming element array, an aberration compensator array, a beam-limit aperture array, and a pre-bending micro-deflector array. The pre-bending micro-deflector array may deflect a plurality of primary sub-beams 211, 212, 213 of primary electron beam 202 to normally enter the beam-limit aperture array, the image-forming element array, and an aberration compensator array. In this arrangement, the image-forming element array may function as a multi-beam array to generate the plurality of sub-beams in the multi-beam path, i.e. primary sub-beams 211, 212, 213. The image forming array may comprise a plurality electron beam manipulators such as micro-deflectors or micro-lenses (or a combination of both) to influence the plurality of primary sub-beams 211, 212, 213 of primary electron beam 202 and to form a plurality of parallel images (virtual or real) of primary beam crossover 203, one for each of the primary sub-beams 211, 212, and 213. The aberration compensator array may comprise a field curvature compensator array (not shown) and an astigmatism compensator array (not shown). The field curvature compensator array may comprise a plurality of micro-lenses to compensate field curvature aberrations of the primary sub-beams 211, 212, and 213. The astigmatism compensator array may comprise a plurality of micro-stigmators to compensate astigmatism aberrations of the primary sub-beams 211, 212, and 213. The beam-limit aperture array may be configured to limit diameters of individual primary sub-beams 211, 212, and 213. FIG. 2 shows three primary sub-beams 211, 212, and 213 as an example, and it should be understood that source conversion unit 220 may be configured to form any number of primary sub-beams. Controller 50 may be connected to various parts of charged particle beam inspection apparatus 100 of FIG. 1, such as source conversion unit 220, electron detection device 240, primary projection apparatus 230, or motorized stage 209. As explained in further detail below, controller 50 may perform various image and signal processing functions. Controller 50 may also generate various control signals to govern operations of the charged particle beam inspection apparatus, including the charged particle multi-beam apparatus.

Condenser lens 210 may further be configured to adjust electric currents of primary sub-beams 211, 212, 213 down-beam of source conversion unit 220 by varying the focusing power of condenser lens 210. Alternatively, or additionally, the electric currents of the primary sub-beams 211, 212, 213 may be changed by altering the radial sizes of beam-limit apertures within the beam-limit aperture array corresponding to the individual primary sub-beams. The electric currents may be changed by both altering the radial sizes of beam-limit apertures and the focusing power of condenser lens 210. If the condenser lens is moveable and magnetic, off-axis sub-beams 212 and 213 may result that illuminate source conversion unit 220 with rotation angles. The rotation angles change with the focusing power or the position of the first principal plane of the movable condenser lens. A condenser lens 210 that is an anti-rotation condenser lens may be configured to keep the rotation angles unchanged while the focusing power of condenser lens 210 is changed. Such a condenser lens 210 that is also movable, may cause the rotation angles not change when the focusing power of the condenser lens 210 and the position of its first principal plane are varied.

Objective lens 231 may be configured to focus sub-beams 211, 212, and 213 onto a sample 208 for inspection and may form three probe spots 221, 222, and 223 on the surface of sample 208.

Beam separator 233 may be, for example, a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary sub-beams 211, 212, and 213. The electrostatic force is equal in magnitude but opposite in direction to the magnetic force exerted by magnetic dipole field of beam separator 233 on the individual electrons. Primary sub-beams 211, 212, and 213 may therefore pass at least substantially straight through beam separator 233 with at least substantially zero deflection angles.

Deflection scanning unit 232, in operation, is configured to deflect primary sub-beams 211, 212, and 213 to scan probe spots 221, 222, and 223 across individual scanning areas in a section of the surface of sample 208. In response to incidence of primary sub-beams 211, 212, and 213 or probe spots 221, 222, and 223 on sample 208, electrons are generated from the sample 208 which include secondary electrons and backscattered electrons. The secondary electrons propagate in three secondary electron beams 261, 262, and 263. The secondary electron beams 261, 262, and 263 typically have secondary electrons (having electron energy ≤50 eV) and may also have at least some of the backscattered electrons (having electron energy between 50 eV and the landing energy of primary sub-beams 211, 212, and 213). The beam separator 233 is arranged to deflect the path of the secondary electron beams 261, 262, and 263 towards the secondary projection apparatus 250. The secondary projection apparatus 250 subsequently focuses the path of secondary electron beams 261, 262, and 263 onto a plurality of detection regions 241, 242, and 243 of electron detection device 240. The detection regions may be the separate detection elements 241, 242, and 243 that are arranged to detect corresponding secondary electron beams 261, 262, and 263. The detection regions generate corresponding signals which are sent to controller 50 or a signal processing system (not shown), e.g. to construct images of the corresponding scanned areas of sample 208.

The detection elements 241, 242, and 243 may detect the corresponding secondary electron beams 261, 262, and 263. On incidence of secondary electron beams with the detection elements 241, 242 and 243, the elements may generate corresponding intensity signal outputs (not shown). The outputs may be directed to an image processing system (e.g., controller 50). Each detection element 241, 242, and 243 may comprise one or more pixels. The intensity signal output of a detection element may be a sum of signals generated by all the pixels within the detection element.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary sub-beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps of scanning process.

Although FIG. 2 shows that apparatus 40 uses three primary electron sub-beams, it is appreciated that apparatus 40 may use two or more number of primary electron sub-beams. The present disclosure does not limit the number of primary electron beams used in apparatus 40.

Figure 3:
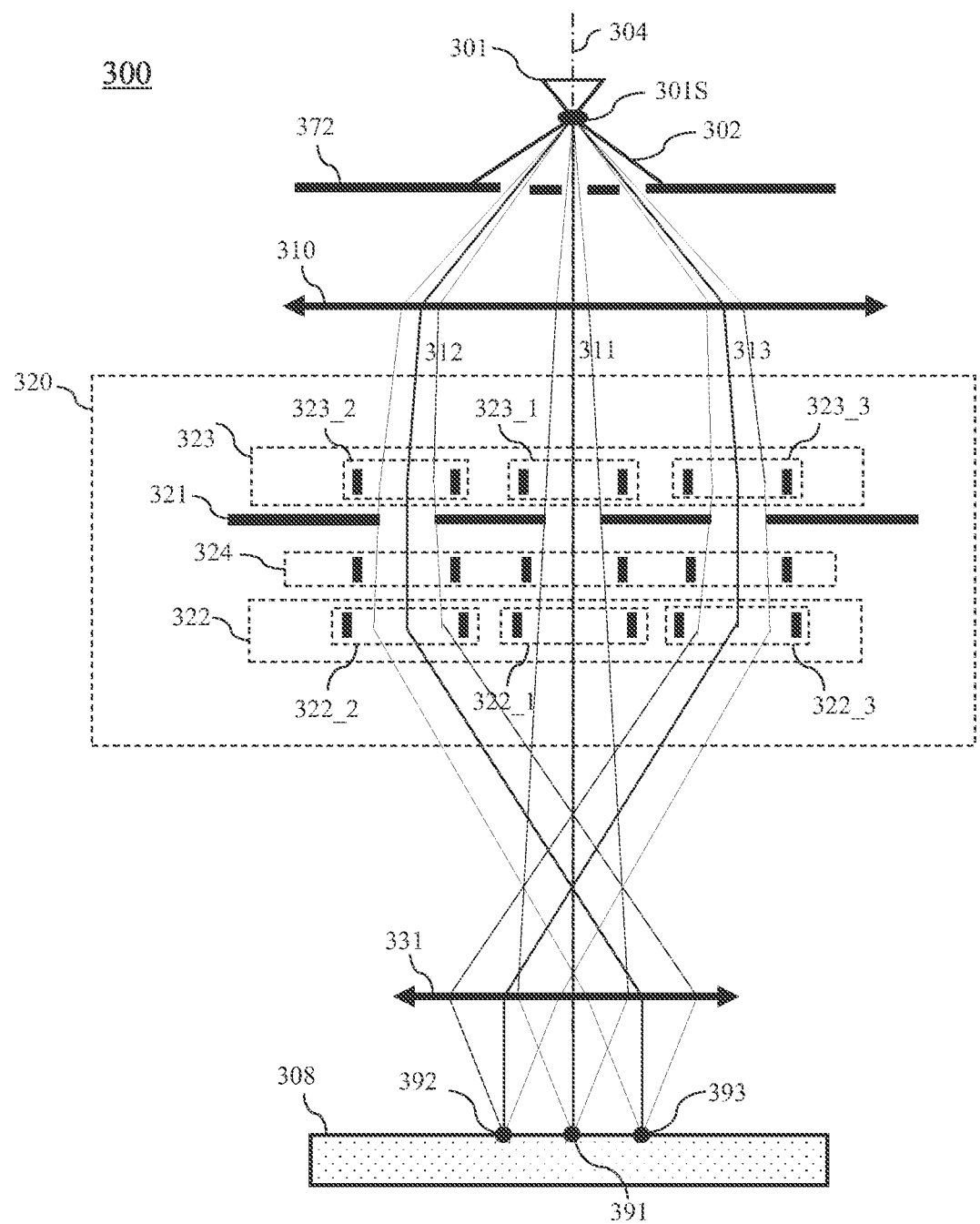
FIG. 3 is a schematic diagram of exemplary multi-beam apparatus illustrating an exemplary configuration of source conversion unit of the exemplary charged particle beam inspection apparatus of FIG. 1.

Reference is now made to FIG. 3, which is a schematic diagram of exemplary multi-beam apparatus illustrating an exemplary configuration of source conversion unit of the exemplary charged particle beam inspection apparatus of FIG. 1. The apparatus 300 may comprise an election source 301, a pre-sub-beam-forming aperture array 372, a condenser lens 310 (similar to condenser lens 210 of FIG. 2), a source conversion unit 320, an objective lens 331 (similar to objective lens 231 of FIG. 2), and a sample 308 (similar to sample 208 of FIG. 2). The election source 301, a pre-sub-beam-forming aperture array 372, a condenser lens 310 may be the components of an illumination apparatus comprised by the apparatus 300. The source conversion unit 320, an objective lens 331 may the components of a projection apparatus comprised by the apparatus 300. The source conversion unit 320 may be similar to source conversion unit 220 of FIG. 2 in which the image-forming element array of FIG. 2 is image-forming element array 322, the aberration compensator array of FIG. 2 is aberration compensator array 324, the beam-limit aperture array of FIG. 2 is beam-limit aperture array 321, and the pre-bending micro-deflector array of FIG. 2 is pre-bending micro-deflector array 323.

The election source 301, the pre-sub-beam-forming aperture array 372, the condenser lens 310, the source conversion unit 320, and the objective lens 331 are aligned with a primary electron-optical axis 304 of the apparatus. The electron source 301 generates a primary-electron beam 302 generally along the primary electron-optical axis 304 and with a source crossover (virtual or real) 301S. The pre-sub-beam-forming aperture array 372 cuts the peripheral electrons of primary electron beam 302 to reduce a consequential Coulomb effect. The Coulomb effect is a source of aberration to the sub-beams due to interaction between electrons in different sub-beam paths. Primary-electron beam 302 may be trimmed into a specified number of sub-beams, such as three sub-beams 311, 312 and 313, by pre-sub-beam-forming aperture array 372 of a pre-sub-beam-forming mechanism. Although three sub-beams and their paths are referred to in the previous and following description, it should be understood that the description is intended to apply an apparatus, tool, or system with any number of sub-beams.

The source conversion unit 320 may include a beamlet-limit aperture array 321 with beam-limit apertures configured to limit the sub-beams 311, 312, and 313 of the primary electron beam 302. The source conversion unit 320 may also include an image-forming element array 322 with image-forming micro-deflectors, 322_1, 322_2, and 322_3. There is a respective micro-deflector associated with the path of each sub-beam. The micro-deflectors 322_1, 322_2, and 322_3 are configured to deflect the paths of the sub-beams 311, 312, and 313 towards the electron-optical axis 304. The deflected sub-beams 311, 312 and 313 form virtual images of source crossover 301S. The virtual images are projected onto the sample 308 by the objective lens 331 and form probe spots thereon, which are the three probe spots, 391, 392, and 393. Each probe spot corresponds to the location of incidence of a sub-beam path on the sample surface. The source conversion unit 320 may further comprise an aberration compensator array 324 configured to compensate aberrations of each of the sub-beams. The aberrations in each sub-beam are typically present on the probe spots, 391, 392, and 393 that would be formed a sample surface. The aberration compensator array 324 may include a field curvature compensator array (not shown) with micro-lenses. The field curvature compensator and micro-lenses are configured to compensate the sub-beams for field curvature aberrations evident in the probe spots, 391, 392, and 393. The aberration compensator array 324 may include an astigmatism compensator array (not shown) with micro-stigmators. The micro-stigmators are controlled to operate on the sub-beams to compensate astigmatism aberrations that are otherwise present in the probe spots, 391, 392, and 393.

The source conversion unit 320 may further comprise a pre-bending micro-deflector array 323 with pre-bending micro-deflectors 323_1, 323_2, and 323_3 to bend the sub-beams 311, 312, and 313 respectively. The pre-bending micro-deflectors 323_1, 323_2, and 323_3 may bend the path of the sub-beams onto the beamlet-limit aperture array 321. The sub-beam path of the incident on beamlet-limit aperture array 321 may be orthogonal to the plane of orientation of the beamlet-limit aperture array 321. The condenser lens 310 may direct the path of the sub-beams onto the beamlet-limit aperture array 321. The condenser lens 310 may focus the three sub-beams 311, 312 and 313 to become parallel beams along primary electron-optical axis 304, so that it is perpendicularly incident onto source conversion unit 320, which may correspond to the beamlet-limit aperture array 321.

The image-forming element array 322, the aberration compensator array 324, and the pre-bending micro-deflector array 323 may comprise multiple layers of sub-beam manipulating devices, some of which may be in the form or arrays, for example: micro-deflectors, micro-lenses, or micro-stigmators.

In source the conversion unit 320, the sub-beams 311, 312 and 313 of the primary electron beam 302 are respectively deflected by the micro-deflectors 322_1, 322_2 and 322_3 of image-forming element array 322 towards the primary electron-optical axis 304. It should be understood that the sub-beam 311 path may already correspond to the electron-optical axis 304 prior to reaching micro-deflector 322_1, accordingly the sub-beam 311 path may not be deflected by micro-deflector 322_1.

The objective lens 331 focuses the sub-beams onto the surface of the sample 308, i.e., it projects the three virtual images onto the sample surface. The three images formed by three sub-beams 311 to 313 on the sample surface form three probe spots 391, 392 and 393 thereon. The deflection angles of sub-beams 311 to 313 are adjusted by the objective lens 311 to reduce the off-axis aberrations of three probe spots 391~393. The three deflected sub-beams consequently pass through or approach the front focal point of objective lens 331.

At least some of the above-described components in FIG. 2 and FIG. 3 may individually, or in combination with each other, be referred to as a manipulator array, or manipulator, because they manipulate one or more beams, or sub-beams, of charged particles.

The above-described multi-beam inspection tool comprises a multi-beam charged particle apparatus, which may be referred to as a multi-beam charged particle optical apparatus or a multi-beam charged particle system, with a single source of charged particles. The multi-beam charged particle apparatus comprises an illumination apparatus and a projection apparatus. The illumination apparatus may generate a multi-beam of charged particles from the beam of electrons from the source. The projection apparatus projects a multi-beam of charged particles towards a sample. At least part of the surface of a sample is scanned with the multi-beam of charged particles.

The multi-beam charged particle apparatus may comprise one or more beam manipulators. In a single beam charged particle apparatus, there may be a beam manipulator for manipulating the path of the beam. In a multi-beam charged particle apparatus, there may be an array of beam manipulators, i.e. a manipulator array, for manipulating the sub-beams of the multi-beam. Each beam manipulator may be, for example, a MEMS device or any type of other device/structure for manipulating a charged particle path. Each beam manipulator may comprise one or more substrates. There may be an opening through each beam manipulator for a sub-beam path through the beam manipulator. The periphery of a through-passage defined by the opening may feature one or more electrodes. Each beam manipulator be configured to manipulate, such as lens (e.g. focus) and/or deflect, a sub-beam path through its opening. The beam manipulators may be provided in an N by M array. N may be, for example, between 2 and 20, such as 5. M may be, for example, between 2 and 20, such as 5. However, N and M may have any values and each of N and M may be several thousand.

A manipulator array, which is an array of beam manipulators, may be formed as a stack of substrates, referred to as a substrate stack. Each substrate in the substrate stack may comprise a plurality of openings, i.e. holes, for providing the sub-beam paths through the substrate stack. The plurality of openings may be referred to as beam path openings. Each beam manipulator in the manipulator array may be constructed by securing, e.g. bonding together, two or more substrate sets, with each substrate set being substantially directly before and/or after another substrate set along the beam path. Each substrate set may comprise one or more substrates.

The performance of each beam manipulator is dependent on the relative alignment of substrates that are bonded together to form the beam manipulator. In particular, a substantial misalignment between corresponding beam path openings in different sets of substrates will distort, or in a severe case prevent, the path of one or more of the sub-beams through the substrate stack.

Embodiments provide techniques for determining the relative alignment of the sets of substrates that are secured together. Embodiments are described below with reference to a plurality of sets of substrates being secured together to form a manipulator array that comprises an array of beam manipulators. However, embodiments also include a plurality of sets of substrates being secured together to form a single beam manipulator. Embodiments further include a plurality of sets of substrates being secured together for any application.

As explained above, each substrate comprises a plurality of openings for providing sub-beam paths. Embodiments include forming a plurality of alignment openings in each substrate in addition to the beam path openings. The alignment openings on one of the major surface sides of the substrate stack are illuminated. The locations and diameters of the alignment openings are such that the relative alignment of substrates in the substrate stack is dependent on the relative locations of the light beams that pass-through alignment openings in the substrate stack. The relative alignment of substrates in the substrate stack may therefore be determined in dependence on an inspection of light beams that pass through the alignment openings.

Figure 4:
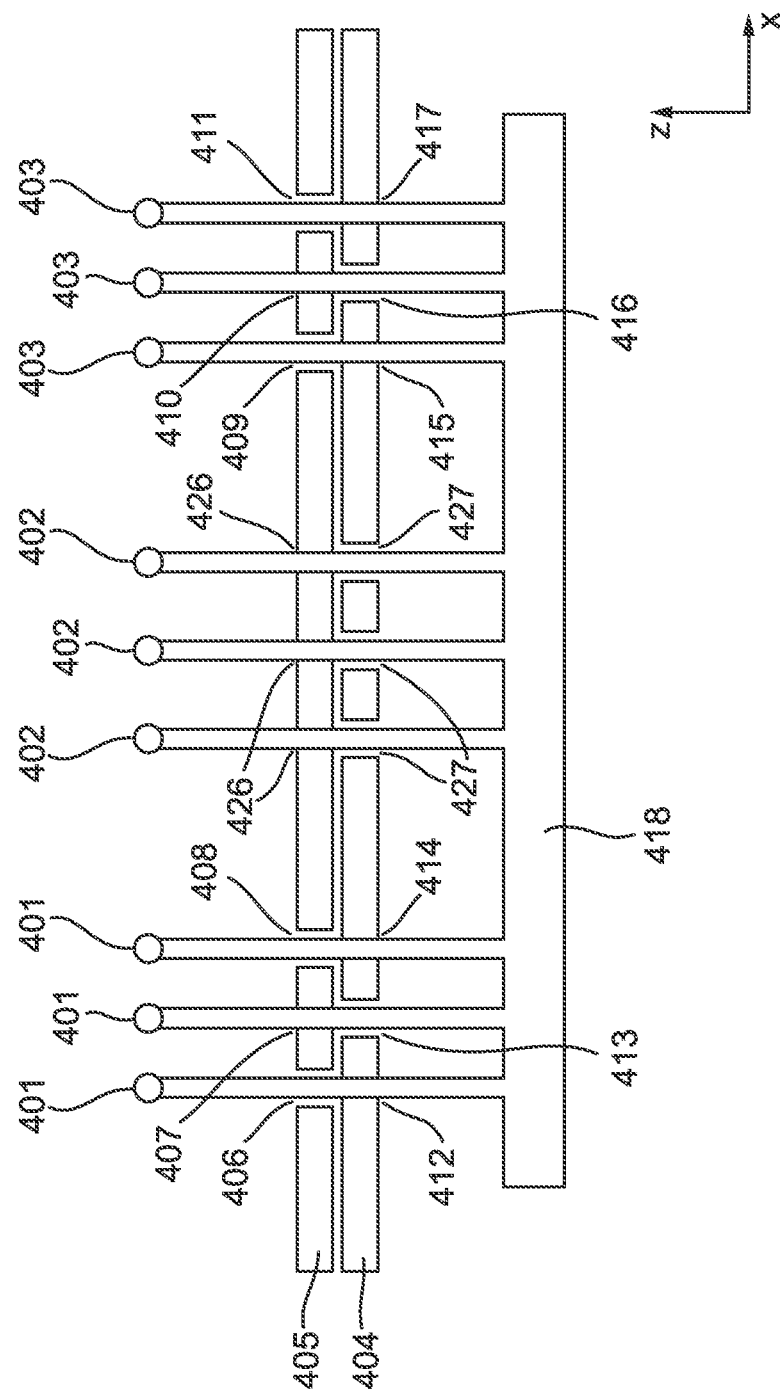
FIG. 4 is schematic diagram showing a cross-section through a stack of two substrates according to some embodiments.

FIG. 4 is schematic diagram showing a cross-section through a stack of two substrates according to some embodiments.

The substrate stack in FIG. 4 comprises a first substrate 404 and a second substrate 405. The first substrate 404 may be referred to as an up-beam substrate 404 because, when the substrate stack is illuminated by the light source 418, the first substrate is the first substrate to be illuminated by charged particles. The second substrate may be referred to as a down-beam substrate. The first substrate 404 comprises a first alignment opening set 412, 413, and 414. The first substrate 404 also comprises a second alignment opening set 415, 416, and 417. The first substrate 404 also comprises a beam path openings 427 for the charged particle beam paths of a multi-beam of the charged particles. The beam path openings 427 are arranged in a pattern in a major surface of the first substrate 404 between the first alignment opening sets and the second alignment opening set.

The second substrate comprises a first alignment opening set 406, 407, and 408. The second substrate also comprises a second alignment opening set 409, 410, and 411. The second substrate 405 also comprises a beam path openings 426 for the charged particle beam paths of a multi-beam of the charged particles. The beam path openings 426 are arranged in a pattern in a major surface of the second substrate 405 between the first alignment opening set and the second alignment opening set.

The second substrate 405 may be an aperture array. When the substrate stack is used in a multi-beam charged particle apparatus, the aperture array is the major surface the substrate stack that is illuminated by charged particles. All of the beam path openings of the second substrate 405 may have a narrower diameter than the corresponding beam path openings of the first substrate 404. The beam path openings in the aperture array define sub-beams. The size and shape of the sub-beams will also be dependent on the beam manipulators along the beam path openings.

In the present example, the second substrate 405 may be referred to as a reference substrate. The reference substrate is the substrate that the positions of the other substrates in the substrate stack are defined relative to. Although any substrate in the substrate stack may be used as a reference substrate, the reference substrate is preferably the substrate that comprises the aperture array. This is because the substrate that comprises the aperture array defines the sub-beams and may therefore have a greater influence on the performance of the manipulator array than any of the other substrates in the substrate stack.

In FIG. 4, the diameter of each of the light spots 402 is dependent on the diameter of the beam part openings in the second substrate 405. The diameter of each of the light spots 402 is not dependent on the diameter of the beam part openings in the first substrate 404 because the beam path openings in the first substrate 404 have a larger diameter than those in the second substrate.

In the first alignment opening set in the second substrate 405, the alignment opening 407 has a narrower diameter than the alignment openings 406 and 408. The alignment opening 407 may be located in between the other alignment openings 406 and 408. Similarly, in the second alignment opening set in the second substrate 405, the alignment opening 410 has a narrower diameter than alignment openings 409 and 411. The alignment opening 410 may be located in between the other alignment openings 409 and 411.

In the first alignment opening set in the first substrate 404, alignment openings 412 and 414 have a narrower diameter than alignment opening 413. The alignment opening 413 may be located in between the other alignment openings 412 and 414. Similarly, in the second alignment opening set in the first substrate 404, alignment openings 415 and 417 have a narrower diameter than opening 416. The alignment opening 416 may be located in between the other alignment openings 415 and 417.

The diameter of all of the alignment openings 412, 414, 415, 417, 407 and 410 may all be substantially the same. Their diameter may be, for example, in the range 100 to 1500 µm.

The diameter of all of the alignment openings 413, 416, 406, 408, 409 and 411 may all be substantially the same. Their diameter may be, for example, in the range 200 to 2000 µm.

Light source 418 is configured to illuminate the alignment openings of an exposed major surface of the first substrate 404. When the exposed major surface of the first substrate 404 is illuminated, optical light beams 401 may pass through the first alignment opening set in both the first substrate 404 and the second substrate 405. Optical light beams 402 may also pass through the beam path openings in both the first substrate 404 and the second substrate 405. Optical light beams 403 may also pass through the second alignment opening set in both the first substrate 404 and the second substrate 405.

For each light beam that has passed through an alignment opening, the spot size of the light beam may be only dependent on the smallest diameter of alignment opening that the light beam has passed through. Furthermore, the location of the light spot may be dependent only on the location of the substrate that comprises the alignment opening with the smallest diameter.

Accordingly, for the first substrate 404, alignment openings 412, 414, 415 and 417 may each determine the spot size of the light beams that pass through these alignment openings. This is because the alignment openings 412, 414, 415 and 417 of the first substrate 404 all have a narrower diameter than the corresponding alignment openings 406, 408, 409 and 411 of the second substrate 405. The location of the light beams that pass through these alignment openings may therefore be dependent on the location of the first substrate 404 only and not the location of the second substrate 405.

Similarly, for the second substrate 405, alignment openings 407 and 410 each determine the spot size of the light beams that pass through these alignment openings. This is because the alignment openings 407 and 410 of the second substrate 405 both have a narrower diameter than the corresponding alignment openings 413 and 416 of the first substrate 404. The location of the light beams that pass through these alignment openings may therefore be dependent on the location of the second substrate 405 only and not the location of the first substrate 404.

The alignment openings 407 and 410 may be referred to as reference openings because they are located in the reference substrate and are openings that define the size and location of a light spot. The alignment openings 412, 414, 415 and 417 may be referred to as comparative openings because they are not located in the reference substrate and are openings that define the size and location of a light spot.

Embodiments may determine the relative alignment of the substrates in the substrate stack in dependence on the relative positions of light beams that have passed through the alignment openings. In particular, the relative positions of the light spots generated in dependence on the reference openings 407 and 410, and the light spots generated in dependence on the comparative openings 412, 414, 415, 417 may be used to determine the relative alignment of the first substrate 404 and the second substrate 405 (i.e. the reference substrate).

The light beams may form light spots on a surface of a light detector, such as a camera. The light detector is not shown in FIG. 4. Each light spot may indicate the position of a light beam that has passed through the substrate stack. The light detector may generate a signal corresponding to the light spots formed. The light detector may comprise a processor that is configured to generate data indicative of the light spot locations from the generated signal. The light detector may transmit the signal to an external processor capable of generating said data indicative of the light spot locations. Embodiments include processing data indicative of the light spot locations so as to compensate for any tilt between the substrate stack and an optical axis of the light detector. The data indicative of the light spot locations may be provided to, and used by, an image generator to generate one or more images. The relative alignment of the substrates may be determined in dependence on the relative positions of the light spots in the one or more images. However, embodiments also include automatically using the data indicative of the light spot locations to determine the alignment of the substrates, without generating any images.

All of the processes for determining the alignment of the substrates in dependence on obtained data indicative of the light spot locations may be performed by a computing system. The computing system may comprise an image generator.

Embodiments include a tool for generating data indicative of the light spot locations. The tool may comprise a holder configured to hold a substrate stack. The tool may comprise an illuminator configured to illuminate at least part of one of the major surfaces of the substrate stack. The tool may comprise one or more light detectors for detecting the positions of light beams. The tool may comprise the above-described computing system for determining the alignment of the substrates in dependence on obtained data indicative of the light spot locations. Alternatively, the computing system may be remote from the tool.

In FIG. 4, each substrate has a substantially planar structure. The plane of each substrate may be defined as being in an x-y plane (in a Cartesian co-ordinate geometry). The substrates are stacked in a direction that is substantially orthogonal to the x-y plane, i.e. along a z-axis in a z-direction. The first substrate 404 is shown as being appropriately aligned with the second substrate 405. In particular, the major surfaces of the substrates are in substantially parallel planes and the beam path openings in the substrates have corresponding locations.

The alignment opening sets in each substrate are configured so that the reference openings 407 and 410, and the comparative openings 412, 414, 415, 417, are arranged along a direction in the plane of the substrate stack, e.g. in the x-direction. The alignment openings in the first alignment opening set in the each substrate are arranged so that the reference opening 407 is located between the two comparative openings 412 and 414. When the first and second substrates are appropriately aligned, a light spot corresponding to the reference opening 407 may be equidistant to light spots corresponding to the comparative openings 412 and 414. Similarly, the alignment openings in the first alignment opening set in the each substrate are arranged so that the reference opening 410 is located between the two comparative openings 415 and 417. When the first and second substrates are appropriately aligned, a light spot corresponding to the reference opening 410 may be equidistant to light spots corresponding to the comparative openings 415 and 417. In each substrate, the beam path openings may be aligned along an axis, such as the x-axis, with first and second alignment opening sets. The beam path openings may be equidistant to each of the first and second alignment opening sets.

In the planes of the substrates and along a direction orthogonal to the x axis, i.e. along a y axis, the alignment openings in each alignment opening set may have substantially zero displacement.

Figure 5:
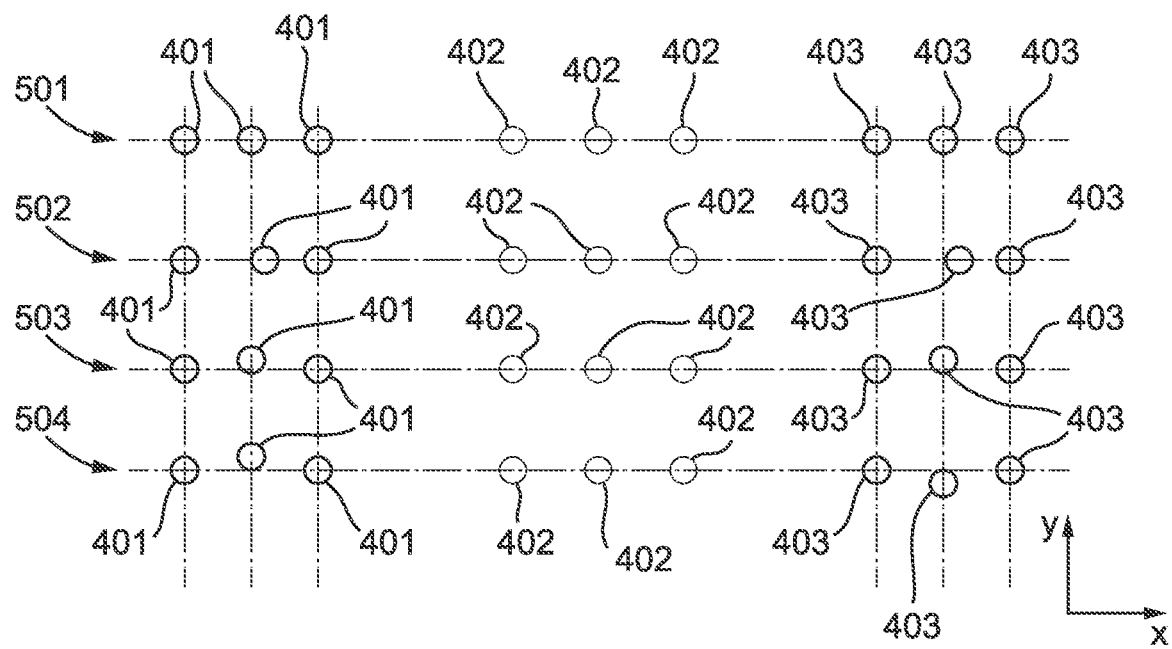
FIG. 5 shows four different relative locations of light spots according to some embodiments.

FIG. 5 shows a planar view of examples of four different relative locations of light spots of the light beams 401, 402 and 403 that have passed through alignment openings in a substrate stack comprising two substrates. The examples of four different relative locations of light spots may correspond to four different relative alignments of the first substrate 404 and the second substrate 405 shown in FIG. 4.

The first example 501 shows a light spot pattern when there is correct alignment between the first substrate 404 and the second substrate 405. The second to fourth examples show light spot patterns with three different types of misalignment.

The relative locations of the light spots in the first example 501 indicate that the first and second substrates are appropriately aligned in x, y and Rz (where Rz is the amount of rotation about the z-axis), as described above for FIG. 4. The light spots from both the first alignment opening set (which is the leftmost in FIG. 5) and the second alignment opening set (which is the rightmost in FIG. 5) are all substantially aligned along the x-axis. This indicates that the substrates are substantially aligned with respect to the y-direction and with the Rz rotational position. That is there is no substantial misalignment of the substrates in the y-direction and that the Rz is appropriate. The light spots from within both the first and second alignment opening sets are all substantially equally spaced in the x-direction. This indicates that the two substrates are substantially aligned in the x-direction. That is there is no substantial misalignment between the substrates in the x-direction.

The relative locations of the generated light spots in the second example 502 indicate that the first and second substrates are appropriately aligned in y and Rz but are misaligned in x. The light spots from within both the first and second alignment opening sets are all substantially lie on the x-axis. This indicates that the substrates are substantially aligned with respect to the y-direction and with the Rz rotational position. However, the detected light spots from within both the first and second alignment opening sets are unequally spaced apart along the x-axis. That is to say, the middle light spot corresponding to each alignment opening set is displaced in the same direction, and with the same magnitude, from the central position between the light spots. This is indicative of a misalignment between the two substrates in the x-direction.

The relative locations of the generated light spots in the third example 503 indicate that the first and second substrates are appropriately aligned in x and Rz but are misaligned in y. Some, but not all, of the light spots from both the first and second alignment opening sets lie on the x-axis. In particular, the middle spots of each set have displacements in the y-direction, relative to the other light spots in each set, of similar displacement and direction. This indicates that there is misalignment of the substrates in the y-direction. Such a light spot pattern indicates of rotational alignment in Rz. The light spots from within both the first and second alignment opening sets are all substantially equally spaced along the x-direction, and this indicates the substrates are aligned in the x-direction. That is there is no substantial misalignment of the two substrates in the x-direction.

The relative locations of the generated light spots in the fourth example 504 indicate that the first and second substrates are appropriately aligned in x and y but are misaligned in Rz. The light spots corresponding to the first alignment opening set are aligned in the x-direction and the central alignment opening is displaced by an amount in a y-direction which can be referred to as a positive y-direction. The light spots corresponding to the second alignment opening set are aligned in the x-direction and the central opening is displaced in the y-direction by the same amount as the central spot of the first alignment opening set but in the opposite y-direction, i.e. the negative y-direction. This similar magnitude of displacement in opposite directions of the central alignment opening of both sets indicates that the substrates are aligned in the y-direction and are rotationally displaced in Rz, i.e. around the z axis. That is, the two substrates are misaligned in Rz. The light spots from within both the first and second sets of alignment openings are all substantially equally spaced in the x-direction, and this indicates that the two substrates are substantially aligned in x-direction; that is there is no substantial misalignment of the substrates in the x-direction.

Accordingly, the relative locations of the light spots may be used to determine the relative locations of the first substrate 404 and the second substrate 405 in x, y, and Rz. An actual substrate misalignment in x, y and/or Rz may be determined to comprise a plurality of separate misalignment components, with each misalignment component being in one of x, y, and Rz. For each substrate in the substrate stack other than the reference substrate, tolerance levels may be set for the relative alignment components, in each of x, y, and Rz, of the substrate to the reference substrate. The tolerance levels may be referred to as degrees of freedom in the positioning of each substrate. The tolerance levels may be different for each substrate in the substrate stack. A substrate stack may be determined to be within an alignment performance specification if the relative alignment components of all of the substrates in the substrate stack to the reference substrate is within the set tolerance levels.

For each substrate in the substrate stack, there may be at least one light beam path through the substrate stack for which the spot size and location of the at least one light beam may be dependent only on the location of the said substrate. That is to say, for each substrate in the substrate stack and on at least one of the light beam paths, said substrate may comprise at least one alignment opening that has a narrower diameter than all of the corresponding alignment openings of the other substrates in the substrate stack.

For different light beam paths, the narrowest diameter of alignment opening that defines the spot size may differ between different substrates. This allows the location of each substrate in the substrate stack to be individually identified by at least one light spot for the substrate.

The number of alignment openings in each alignment opening set may be dependent on the number of substrates in the substrate stack. The number of alignment openings in each alignment opening set may be greater than, or equal to, the number of substrates in the substrate stack such that, for each substrate, there is at least one light spot that corresponds to only its location. In an arrangement there is at least one more aperture than the number of substrates in the substrate stack.

Embodiments may be used to determine the relative alignments of any number of substrates in the substrate stack. For example, the number of substrates in the substrate stack may be 2 to 20.

Although embodiments include there being only one alignment opening set, there are preferably at least two alignment opening sets. Preferably, two alignment opening sets are located at opposite ends of a major surface of a substrate. For example, two alignment opening sets may be located at opposite ends of the x axis, as shown in FIG. 5. A relatively large spacing between the sets of alignment openings increases the accuracy of the determination of the Rz alignment.

As described above, the alignment opening sets may be provided on either side of the beam path openings. Each alignment opening set may be spaced a substantial distance from the beam path openings such that the alignment openings do not affect, or otherwise influence, the active areas of each substrate, as may be required for providing beam manipulators.

Embodiments may be used for determining if two or more substrates in a substrate set that have been bonded together are aligned in x, y, and Rz within the limits of a performance specification. If the alignment of the substrates is not within the performance specification, a determination may be made to scrap the set of substrates such that a final product comprising the substrate sets is not defective. Alternatively, a determination may be made to de-bond the substrates and re-bond them with adjusted alignments.

Embodiments may also be used for determining if a substrate stack, which comprises two or more substrate sets that have been bonded together, are appropriately aligned in x, y, and Rz. If the substrate sets are not appropriately aligned, a determination may be made to scrap the substrate stack such that a final product comprising the substrate stack is not defective. Alternatively, a determination may be made to de-bond the substrate sets and re-bond them with adjusted alignments.

For each substrate set that comprises a plurality of substrates, the substrates may be arranged such that for each substrate in the substrate set, there is at least one light beam path through the substrate set for which the spot size and location of the at least one light beam is dependent only on the location of the said substrate. Alternatively, the substrates may be configured such that, for some of the substrates, there are no light beam spot sizes and locations that are dependent on the locations of the substrates. This may be appropriate, for example, when the accuracy of the x, y, and Rz locations of some of the substrates in the set of substrates is not critical for all of the substrates in the set of substrates.

Embodiments also include determining the relative alignment in x, y and Rz of substrates, or substrate sets, before they have been bonded together. The light spot locations may be used to adjust the locations of the substrates, or substrate sets, in x, y and Rz so that the substrates, or substrate sets, are appropriately aligned prior to them being bonded together.

The configuration, i.e. arrangement, of alignment openings in each alignment opening set may be substantially the same. The alignment openings in each alignment opening set may be configured such that the alignment openings are configured in a substantially straight line. Alternatively, the alignment openings in each alignment opening set may be configured such that the alignment openings are configured in a plurality of substantially straight lines.

Figure 6A:
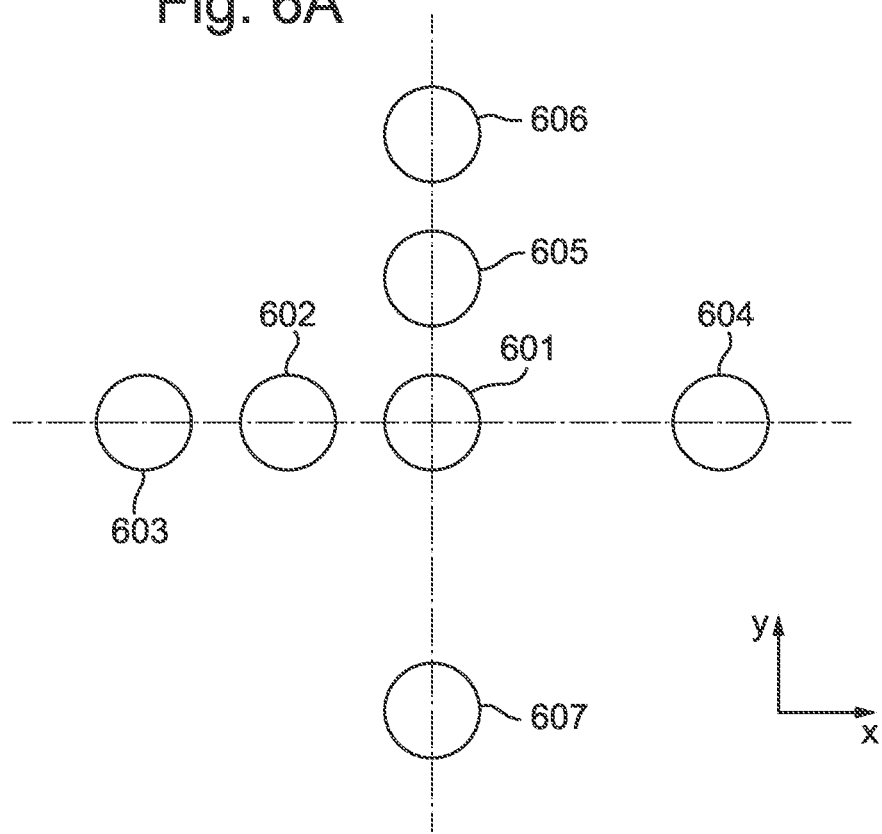

FIG. 6A shows a possible configuration of an alignment opening set. The alignment openings in each alignment opening set are configured such that the alignment openings are configured in two orthogonal substantially straight lines. The orthogonal lines that alignments marks are aligned along are parallel with x and y axes. It should be noted that FIG. 6A only shows exemplary relative locations of the alignment openings. FIG. 6A does not indicate the relative diameters, i.e. sizes, of the alignment openings because these differ between the substrates in the substrate stack.

The alignment opening set shown in FIG. 6A may be used in a substrate stack that comprises more than two substrates. For example, the alignment opening set may be used for a substrate stack that comprises five substrates. One of the substrates in the substrate stack may be a reference substrate that the alignments of the other substrates are determined relative to. As described earlier, the reference substrate may be a substrate for which the beam path openings are an aperture array that the sub-beam paths are defined by. The alignment opening 601 may be narrowest in the reference substrate. The alignment opening 601 may therefore be referred to as a reference opening. For all of the alignment openings 602, 603, 604, 605, 606 and 607, the narrowest alignment openings is in a substrate other than the reference substrate. All of the alignment openings 602, 603, 604, 605, 606 and 607 may therefore be referred to as comparative openings.

The alignment openings 603 and 604 may both be narrowest in the same substrate and therefore comparative openings for said same substrate. An advantage of this is that, when the substrate comprising these comparative openings is correctly aligned with the reference substrate, the light spots generated by the alignment openings 601, 603 and 604 are all aligned in an x-direction and equally spaced. The earlier described techniques with reference to FIG. 5 may therefore be easily used to determine any misalignment components.

Similarly, the alignment openings 606 and 607 may both be comparative openings for the same substrate, which is different from the substrate that has alignment openings 603 and 604 as alignment openings. When the substrate with alignment openings 606 and 607 as comparative openings is correctly aligned with the reference substrate, the light spots generated by the alignment openings 601, 606 and 607 are all aligned in a y-direction and equally spaced. The earlier described techniques with reference to FIG. 5 may therefore be easily used to determine any misalignment components.

The alignment opening 602 may be a comparative opening for a substrate for which none of the other alignment openings are a comparative opening. Only one light spot will therefore be indicative of the location of the substrate for which alignment opening 602 is the comparative opening. The displacements in the x and y directions of the light spots from the comparative and reference openings can be determined. From this, the relative alignments of the substrate for which alignment opening 602 is a comparative opening and the reference substrate may be determined.

Similarly, the alignment opening 605 may be a comparative opening for a substrate for which none of the other alignment openings are a comparative opening. Only one light spot will therefore be indicative of the location of the substrate for which alignment opening 605 is the comparative opening. The displacements in the x and y directions of the light spots from the comparative and reference openings can be determined. From this, the relative alignments of the substrate for which alignment opening 605 is a comparative opening and the reference substrate may be determined.

The relative alignment to the reference substrate can be determined with greater accuracy for substrates with more than one comparative opening. However, whether or not the alignment of a substrate meets a performance specification may still be determined when there is only one comparative opening for a substrate. Accordingly, the substrates in the substrate stack for with the most critical alignment tolerances preferably have more than one comparative opening. Having only one comparative opening for the other substrates in the substrate stack may be appropriate and advantageously reduce the number of alignment openings that are required.

The alignment opening set shown in FIG. 6A may preferably be used together with a further alignment opening set. The further alignment opening set may be, for example, the same as that shown in FIG. 6A or as shown in FIG. 6B. The alignment opening set shown in FIG. 6B may be a substantial mirror image of the alignment opening set shown in FIG. 6A. That is, the positions of the alignment openings in the different alignment opening sets may have reflective symmetry about a y-axis. The alignment opening sets in FIGS. 6A and 6B may be provided at opposite ends of the major surface of a substrate. The alignment opening sets in FIG. 6B may be configured so that the alignment openings 601',

602', 603', 604', 605', 606' and 607' provide the same correspondence of reference and comparative openings to each substrate as the alignment openings 601, 602, 603, 604, 605, 606 and 607 in FIG. 6A.

The use of more than one alignment opening set increases the number of comparative openings that are provided. This both increases the accuracy with which any misalignments may be determined and the number of substrates for which one or more comparative openings may be provided.

Further alignment openings may be added to the two alignment opening sets shown in FIGS. 6A and 6B. Each further alignment opening will provide a comparative opening for a substrate in the substrate stack. Preferably, each further alignment opening is either located along the y-direction or the x-direction so that it is displaced from the reference opening in only the x-direction or only the y-direction. However, an alignment opening may be positioned in an alignment opening set at any location so long as its relative position at least to the reference opening 407 can be determined. In particular, embodiments include providing further alignment openings along a diagonal relative to the x and y directions in FIGS. 6A and 6B.

A substrate stack is typically provided on a printed circuit board, PCB. The PCB may provide both a physical support for the substrate stack and also electrical connections to the substrates in the substrate stack. The PCB may also support other components than the substrate stack. The manufacturing processes of a device may therefore comprise the process of positioning the substrate stack on a PCB. Embodiments include techniques for determining if a substrate stack is appropriately positioned on the PCB. The PCB is provided with PCB alignment structures that can be used to determine the relative alignment of the substrate stack and the PCB.

The PCB may be a planar structure with an upper major surface and a lower major surface. The substrate stack may be provided on the upper major surface of the PCB. The dimensions of the major surfaces of the PCB may be larger than the corresponding dimensions of the major surfaces all of the substrates in the substrate stack.

As described earlier, the substrate stack may comprise a plurality of alignment opening sets and also beam path openings. There may be a single large opening through the PCB so that, in use, the multi-beam of charged particles can travel through both the beam path openings and the single opening through the PCB. The single opening in the PCB may be large enough for light beams to both travel through the alignment opening sets and also through the PCB. Alternatively, the PCB may comprise further openings so that all of the light beams that pass through the substrate stack can also pass through the PCB.

As explained above, the PCB is provided with PCB alignment structures that can be used to determine the relative alignment of the substrate stack and the PCB. A PCB alignment structure may comprise a marker provided on the upper major surface of the PCB. The marker may be, for example, an optical reflector such as a fiducial mark. The marker may have a characteristic pattern. A PCB alignment structure may alternatively be a through passage through the PCB.

Each PCB alignment structure may be spaced away from the area on the upper major surface of the PCB that is covered by the substrate stack after assembly. Each PCB alignment structure is therefore not covered by the substrate stack when the substrate stack is on the PCB. The PCB alignment structures may be arranged such that, when the substrate stack is positioned on the PCB with a correct alignment, the PCB alignment structures are, in plan view, substantially linearly aligned with the alignment opening sets in the stack. In an example, the substrate stack is arranged between at least two PCB alignment structures and the PCB alignment structures are substantially linearly aligned with the alignment opening sets in the substrate stack in the x direction.

Embodiments include determining the relative alignment of the PCB and the substrate stack by illuminating the upper major surfaces of the stack and the PCB. As described earlier, illumination by light beams, that are dependent on the position of the substrate stack, may pass through both the PCB and also the alignment opening sets and/or beam path openings through the substrate stack. The position of the substrate stack may be determined in dependence of the position of light beams through the alignment opening sets and/or the beam path openings.

The illumination will also generate reflected light beam(s) from each PCB alignment structure that is an optical reflector. The position of the PCB may be determined in dependence on the position of the reflected light beam(s).

The illumination will also generate transmitted light beam(s) that pass through each PCB alignment structure that is an opening through the PCB. The position of the PCB may be determined in dependence on the position of the transmitted light beam(s)

The relative alignment of the PCB and the substrate stack in x, y, and Rz may be determined in dependence on the relative positions of light spots from the light beams that are dependent on the position of the substrate stack and light spots from the light beams that are dependent on the position of the PCB.

The light spots from the transmitted light beam(s) may be generated in the same plane as light spots from the light beams that have passed through the substrate stack. The light spots from the reflected light beam(s) may be generated in a different plane as light spots from the other light beams.

The light beams may form light spots on a surface of one or more light detectors, such as a cameras. Each light spot may indicate the position of a light beam that has either passed through the substrate stack or is dependent on the location of a PCB alignment structure. A light spot signal may be generated by each light detector on which a light spot is incident. Each light spot signal may be indicative of light spot location data generated by a photonic detector. Data indicative of the light spot locations may be generated and/or captured by the one or more light detectors. Embodiments include processing data indicative of the light spot locations so as to compensate for any tilt between PCB and/or substrate stack and the optical axes of the one or more light detectors. The data indicative of the light spot locations may be provided to, and used by, an image generator to generate one or more images and the relative alignment of the substrate stack and PCB may be determined in dependence on the relative positions of the light spots in the one or more images. However, embodiments also include automatically using the data indicative of the light spot locations to determine the relative alignment of the substrate stack and PCB.

All of the processes for determining the alignment of the PCB and substrate stack in dependence on obtained data indicative of the light spot locations may be performed by a computing system. The computing system may comprise an image generator.

Embodiments include a tool for generating data indicative of the light spot locations. The tool may comprise a holder configured to hold a PCB with a substrate stack on it. The tool may comprise an illuminator configured to illuminate at least part of one of the major surfaces of the PCB and substrate stack. The tool may comprise one or more light detectors for detecting the positions of light beams. The tool may comprise the above-described computing system for determining the alignment of the PCB and substrate stack in dependence on obtained data indicative of the light spot locations. Alternatively, the computing system may be remote from the tool.

Embodiments may be used for determining if a PCB and substrate stack that have been bonded together are aligned in x, y, and Rz within the limits of a performance specification. If the alignment is not within the performance specification, a determination may be made to scrap the PCB and substrate stack such that a final product comprising the substrate stack on the PCB is not defective. Alternatively, a determination may be made to de-bond the substrate stack and PCB. The substrate stack and PCB may then be re-bonded with corrected alignments.

Embodiments also include a technique for determining the relative Rx, Ry and z positions of substrates in a substrate stack.

As described earlier, each substrate in the substrate stack has a substantially planar structure that is substantially in the x-y plane. The substrates in the substrate stack are stacked in the z-direction. The rotational displacement about the x-direction is referred to as Rx. The rotational displacement about the y-direction is referred to as Ry. The upper major surface of each substrate in the substrate stack may be substantially planar, for example rectangular. The sides of the rectangle may be substantially in the x-direction and the y-direction, respectively.

For each substrate in the substrate stack, its dimensions in the x-direction and the y-direction may be greater than or equal to that of all of the substrates in the substrate stack that are above it. That is to say, the uppermost substrate in the substrate stack may have the smallest dimensions in the x-direction and the y-direction of all of the substrates in the substrate stack. The dimensions in the x-direction and the y-direction of each other substrate in the substrate stack may be greater than or equal to that of the substrate immediately above it. The substrate stack may have the appearance of a step pyramid, with each step corresponding to an exposed portion of a major surface of a substrate in the substrate stack. The substrate stack may be of stepped substrates of successively smaller cross-sectional area.

Embodiments include using an optical height sensor to generate a height map over the upper surface of the substrate stack. A number of known optical height sensors may be used. These may measure the distance in the z-direction to a surface in dependence on emitted and reflected light. beams. The light beams may be as laser beams. The height map shows the z-position of the exposed surfaces of the upper major surfaces of each of the substrates in the substrate stack. Embodiments include using the variation in the z-positions provided by the optical height map to determine the relative Rx, Ry and z positions of the substrates in the substrate stack.

Embodiments also include obtaining an optical height map of a substrate stack on the PCB and using the optical height map to determine the relative Rx, Ry and z positions of the PCB and the substrate stack.

Embodiments include a number of modifications and variations to the techniques described above.

In FIG. 4, light spots are generated by illuminating a substrate stack with light from a light source 418 that is positioned below the substrate stack. Embodiments also include generating light spots by illuminating a substrate stack with light from a light source 418 that is positioned above the substrate stack.

The multi-beam charged particle apparatus could be a component of an inspection (or metro-inspection) tool or part of an e-beam lithography tool. The multi-beam charged particle apparatus according to embodiments may be used in a number of different applications that include electron microscopy in general, not just SEM, and lithography.

Embodiments include a multi-beam inspection and/or metrology tool that comprises a beam manipulator device that has been made according to the techniques of embodiments. The beam manipulator device may be part of a scanning device arranged to project a multi-beam of charged particles onto a sample. The multi-beam inspection tool may comprise a detector that is arranged to detect charged particles, such as secondary electrons, that are received from the illuminated sample.

Embodiments also include a multi-beam lithography tool that comprises the above-described beam manipulator device.

In particular, the multi-beam charged particle apparatus may comprise both the above-described beam manipulator device and any of the components of the apparatuses described above with reference to FIGS. 1 to 3.

The multi-beam charged particle apparatus may comprise a single source of charged particles, as shown in FIGS. 1 to 3. Alternatively, the multi-beam charged particle apparatus may comprise a plurality of sources of charged particles. There may be a separate column for each source and a manipulator devices according to embodiments provided in each column. Alternatively, the multi-beam charged particle apparatus may comprise a plurality of sources of charged particles and only a single column.

Throughout embodiments a z-direction is described, and this may be the charged particle optical axis. This axis describes the path of charged particles through, and output from, the illumination apparatus. The sub-beams of an output multi-beam may all be substantially parallel to the charged particle optical axis. The charged particle optical axis may be the same as, or different from, a mechanical axis of the illumination apparatus.

A particularly preferred application of embodiments is in the manufacture and testing of a substrate stack and PCB for use as a beam manipulator in a charged particle apparatus. However, the techniques of embodiments may more generally be applied in the manufacture and testing of any substrate stack and PCB for use any application. Embodiments allow the alignment of the substrates in the substrate stack to be determined. Embodiments may also be used to determine the relative alignment of a PCB and any component positioned on the PCB.

Embodiments include the following statements.

According to a first aspect of the disclosed embodiments, there is provided a substrate stack comprising a plurality of substrates, wherein: each substrate in the substrate stack comprises at least one alignment opening set; the at least one alignment opening set in each substrate is aligned for a light beam to pass through corresponding alignment openings in each substrate; and each substrate comprises at least one alignment opening that has a smaller diameter than the corresponding alignment openings in the other substrates.

Preferably, each substrate in the substrate stack comprises a plurality of alignment opening sets; and each alignment opening set of each substrate in the substrate stack is configured such that, for each one of the substrates in the substrate stack, there is at least one light beam path through the alignment opening sets that is indicative of the position of said one substrate relative to the other substrates.

Preferably, the alignment openings in each alignment opening set are configured such that the alignment openings make a pattern that includes a substantially straight line.

Preferably, the alignment openings in each alignment opening set are configured such that the alignment openings make a pattern that includes a plurality of substantially straight lines.

Preferably, the alignment openings in each alignment opening set are configured such that the alignment openings make a pattern that includes two substantially straight lines that intersect each other substantially orthogonally.

Preferably, the substrate stack comprises an array of beam manipulators; and each beam manipulator in the array is configured to manipulate a sub-beam of a multi-beam of charged particles.

Preferably, the array of beam manipulators is an N by M array; N is between 2 and 20, such as 5; and M is between 2 and 20, such as 5.

Preferably: each substrate comprises at least first and second alignment opening sets; each alignment opening set on a substrate is on a different part of the substrate to the array of beam manipulators; and the array of beam manipulators is arranged between the first alignment opening set and the second alignment opening set.

Preferably, the first and second alignment opening sets of each substrate are located at opposite ends of a major surface of the substrate.

According to a second aspect of the disclosed embodiments, there is provided a method for determining the alignment of substrates in a substrate stack that comprises a plurality of substrates, the method comprising: determining the positions of a plurality of light beams that have passed through a respective plurality of alignment openings defined in each substrate in the substrate stack; and determining the relative x, y, and Rz alignments of at least two substrates in the substrate stack in dependence on the determined positions; wherein: for each light beam path through the substrate stack, the alignment opening of one of the substrates on the light beam path has a smaller diameter than all of one or more other alignment openings of respective one or more other substrates on the light beam path; and for each one of at least two of the plurality of light beam paths, a different one of the substrates on the light beam path has an alignment opening with a smaller diameter than all of one or more other alignment openings of respective one or more other substrates on the light beam path such that, for each one of at least two substrates in the substrate stack, there are one or more light beams paths with positions that are indicative of the position of only said one substrate.

Preferably, the alignment opening diameters in all of the substrates are configured such that, for each one of the substrates, the positions of one or more light beam paths are dependent on only said one substrate.

Preferably, each substrate in the substrate stack has a substantially planar structure; and the substrates in the substrate stack are stacked in a direction that substantially orthogonal to the planar structure.

Preferably, each substrate in the substrate stack comprises a plurality of alignment opening sets; and each alignment opening set of each substrate in the substrate stack is configured such that, for each one of the substrates in the substrate stack, there is at least one light beam path through the alignment opening sets that is indicative of the position of said one substrate relative to the other substrates.

Preferably, the configuration of alignment openings in each alignment opening set is substantially the same.

Preferably, the alignment openings in each alignment opening set are configured such that the alignment openings make a pattern that includes a substantially straight line.

Preferably, the alignment openings in each alignment opening set are configured such that the alignment openings make a pattern that includes a plurality of substantially straight lines.

Preferably, the alignment openings in each alignment opening set are configured such that the alignment openings make a pattern that includes two substantially straight lines that intersect each other substantially orthogonally.

Preferably, the substrate stack comprises an array of beam manipulators; and each beam manipulator in the array is configured to manipulate a sub-beam of a multi-beam of charged particles.

Preferably, one or more of the substrates comprises at least part of one or more beam manipulators in the array of beam manipulators.

Preferably, the array of beam manipulators is an N by M array; N is between 2 and 20, such as 5; and M is between 2 and 20, such as 5.

Preferably: each substrate comprises at least first and second alignment opening sets; each alignment opening set on a substrate is on a different part of the substrate to the array of beam manipulators; and the array of beam manipulators is arranged between the first alignment opening set and the second alignment opening set.

Preferably, the first and second alignment openings of each substrate are located at opposite ends of a major surface of the substrate.

Preferably, the arrangement of the alignment openings in the first alignment opening set has mirror symmetry with the arrangement of the alignment openings in the second alignment opening set.

Preferably, the method further comprises: illuminating the alignment openings on the substrate stack of substrates such that a plurality of light beams travel through the substrate stack; obtaining data indicative of the light beam locations; determining the relative alignment of substrates in the substrate stack in dependence on the data indicative of the light beam locations.

Preferably, the method further comprises generating one or more images that indicate the relative positions of the plurality of light beams in dependence on the data indicative of the light beam locations.

Preferably, the data indicative of the light beam locations is obtained by a light detector, and the method further comprises processing the data indicative of the light beam locations so as to compensate for any tilt between the substrate stack and an optical axis of the light detector.

Preferably the method further comprises determining if the alignment of substrates within the substrate stack meets a performance specification in dependence on the determined x, y, and Rz alignment of the substrates.

According to a third aspect of the disclosed embodiments, there is provided a computing system configured to determine the alignment of substrates in a substrate stack by performing the method according to the second aspect.

According to a fourth aspect of the disclosed embodiments, there is provided a tool for obtaining data indicative of light beam locations, the tool comprising: a stack holder configured to hold a substrate stack according to the first aspect; an illuminator configured to illuminate at least part of a surface of the substrate stack; and a light detector configured to generate data indicative of the light beam locations in dependence on a plurality of light beams that have passed through the substrate stack.

According to a fifth aspect of the disclosed embodiments, there is provided a system comprising the tool according to the fourth aspect and the computing system according to the third aspect.

According to a sixth aspect of the disclosed embodiments, there is provided a method for determining the alignment of substrates in a substrate stack, the substrate stack having at least two substrates, wherein in each of the substrates there are a plurality of alignment openings that align with corresponding alignment openings in the other substrates of the substrate stack such that there is a through passage through the substrate stack associated with each alignment opening in each substrate, the method comprising: determining the relative positions of a plurality of light beams, each light beam having passed along a light path through the substrate stack via a respective through passage; and determining the relative x, y, and Rz alignments of the substrates in the substrate stack in dependence on the determined positions; wherein: the alignment opening of one of the substrates that defines the through passage for a corresponding light path through the through passage has a smaller diameter than the other alignment openings that define the through passage; and for each light path a different substrate in the substrate stack has an diameter with a smaller diameter than the other alignment openings that define the corresponding through passage in the substrate stack.

Preferably, the light paths are configured such that: each light path has a position indicative of one substrate in the substrate stack relative to the other substrate in the substrate stack, and/or the relative positions of the light paths are indicative of the x, y, and Rz alignments of the substrates in the substrate stack.

According to a seventh aspect of the disclosed embodiments, there is provided a substrate stack of substrates comprising beam manipulators, the substrate stack having at least two substrates, wherein in each substrate there are a plurality of alignment openings that align with corresponding alignment openings in the other substrates of the substrate stack such that there is a through passage through the substrate stack associated with each alignment opening in each substrate, wherein each of the plurality of through passages is for the passage of a light beam and the light beams are suitable for determining the relative x, y, and Rz alignments of the substrates in the substrate stack; wherein: the alignment opening of one of the substrates, that defines the through passage for a corresponding light path through the through passage, has a smaller diameter than the other alignment openings that define the through passage; and a different substrate in the substrate stack has an alignment opening with a smaller diameter than the other alignment openings that define the corresponding through passage in the substrate stack.

Preferably, each through passage is for passage of a different light path; each light path has a position indicative of one substrate in the substrate stack relative to the other substrates in the substrate stack; and/or the relative positions of the light paths are indicative of the x, y, and Rz alignments of the substrates in the substrate stack.

According to an eighth aspect of the disclosed embodiments, there is provided a combination of a printed circuit board, PCB, and the substrate stack of clauses 33 or 34, the substrate stack being provided on the PCB, wherein: in the PCB is defined an opening configured to be aligned with the through passage in the substrate stack for interacting with a stack light source; and a surface of the PCB comprises a plurality of alignment structures configured to interact with a PCB light source.

Preferably, the PCB and the substrate stack are configured so that interaction of the stack light source with the through passage in the substrate stack and the corresponding opening in the PCB and the interaction of the PCB light source with the plurality of alignment structures enables the relative x, y, and Rz alignments of the substrate stack and the PCB to be determined.

According to a ninth aspect of the disclosed embodiments, there is provided a combination of a printed circuit board, PCB, and substrate stack in which is defined a plurality of through passages for beam path openings, the substrate stack being provided on the PCB, wherein in a surface of the PCB is a plurality of alignment structures configured to interact with a light source for enabling the alignment of the PCB to be determined.

According to a tenth aspect of the disclosed embodiments, there is provided a method for determining the relative alignments of a substrate stack and a printed circuit board, PCB, wherein the substrate stack is provided on the PCB, the method comprising: determining the positions of a first plurality of light beams that have passed through both a respective plurality of openings through the substrate stack and at least one opening in the PCB; determining the positions of a second plurality of light beams that are dependent on a plurality of PCB alignment structures; and determining the relative x, y, and Rz alignments of the substrate stack and the PCB in dependence on the determined positions of the first and second plurality of light beams.

Preferably, the PCB alignment structures comprise markers on the PCB that are configured to reflect at least some of the second plurality of light beams; wherein the positions of the second plurality of light beams are determined after the second plurality of light beams have been reflected off a respective plurality of markers on the PCB.

Preferably, the PCB alignment structures comprise one or more alignment openings in the PCB; wherein the positions of the second plurality of light beams are determined after the second plurality of light beams has passed through a respective plurality of alignment openings through the PCB.

Preferably, none of the second plurality of light beams passes through the substrate stack.

Preferably, the method further comprises: illuminating the PCB and the substrate stack; obtaining data that indicates the positions of the first and second plurality of light beams; and determining the relative x, y, and Rz alignments of the substrate stack and the PCB in dependence on the obtained data that indicates the positions of the first and second plurality of light beams.

Preferably, the one more images are generated by a light detector, and the method further comprises processing data that indicates the positions of the first and second plurality of light beams so as to compensate for any tilt between the substrate stack and an optical axis of the light detector.

Preferably, the method further comprises determining if the relative alignment of the PCB and substrate stack meets a performance specification in dependence on the determined x, y, and Rz alignments.

According to an eleventh aspect of the disclosed embodiments, there is provided a computing system configured to determine the alignment of a PCB and a substrate stack by performing the method according to the tenth aspect.

While the disclosed embodiments have been described in connection with various examples, other embodiments will be apparent to those skilled in the art from consideration of the specification and practice of the technology disclosed herein. It is intended that the specification and examples be considered as exemplary only, with a true scope and spirit being indicated by the following claims and clauses.

There is provided the following clauses; Clause 1: A substrate stack comprising a plurality of substrates, wherein: each substrate in the substrate stack comprises at least one alignment opening set; the at least one alignment opening set in each substrate is aligned for a light beam to pass through corresponding alignment openings in each substrate; and each substrate comprises at least one alignment opening that has a smaller diameter than the corresponding alignment openings in the other substrates.

Clause 2: The substrate stack according to clause 1, wherein each substrate in the substrate stack comprises a plurality of alignment opening sets; and each alignment opening set of each substrate in the substrate stack is configured such that, for each one of the substrates in the substrate stack, there is at least one light beam path through the alignment opening sets that is indicative of the position of said one substrate relative to the other substrates.

Clause 3: The substrate stack according to any of clauses 1 or 2, wherein the alignment openings in each alignment opening set are configured such that the alignment openings make a pattern that includes a substantially straight line.

Clause 4: The substrate stack according to any of clauses 1 or 2, wherein the alignment openings in each alignment opening set are configured such that the alignment openings make a pattern that includes a plurality of substantially straight lines.

Clause 5: The substrate stack according to clause 1 or 2, wherein the alignment openings in each alignment opening set are configured such that the alignment openings make a pattern that includes two substantially straight lines that intersect each other substantially orthogonally.

Clause 6: The substrate stack according to any preceding clause, wherein the substrate stack comprises an array of beam manipulators; and each beam manipulator in the array is configured to manipulate a sub-beam of a multi-beam of charged particles.

Clause 7: The substrate stack according to clause 6, wherein the array of beam manipulators is an N by M array; N is between 2 and 20, such as 5; and M is between 2 and 20, such as 5.

Clause 8: The substrate stack according to any preceding clause, wherein: each substrate comprises at least first and second alignment opening sets; each alignment opening set on a substrate is on a different part of the substrate to the array of beam manipulators; and the array of beam manipulators is arranged between the first alignment opening set and the second alignment opening set.

Clause 9: The substrate stack according to clause 8, wherein the first and second alignment opening sets of each substrate are located at opposite ends of a major surface of the substrate.

Clause 10: A method for determining the alignment of substrates in a substrate stack that comprises a plurality of substrates, the method comprising: determining the positions of a plurality of light beams that have passed through a respective plurality of alignment openings defined in each substrate in the substrate stack; and determining the relative x, y, and Rz alignments of at least two substrates in the substrate stack in dependence on the determined positions; wherein: for each light beam path through the substrate stack, the alignment opening of one of the substrates on the light beam path has a smaller diameter than all of one or more other alignment openings of respective one or more other substrates on the light beam path; and for each one of at least two of the plurality of light beam paths, a different one of the substrates on the light beam path has an alignment opening with a smaller diameter than all of one or more other alignment openings of respective one or more other substrates on the light beam path such that, for each one of at least two substrates in the substrate stack, there are one or more light beams paths with positions that are indicative of the position of only said one substrate.

Clause 11: The method according to clause 10, wherein the alignment opening diameters in all of the substrates are configured such that, for each one of the substrates, the positions of one or more light beam paths are dependent on only said one substrate.

Clause 12: The method according to clause 10 or 11, wherein each substrate in the substrate stack has a substantially planar structure; and the substrates in the substrate stack are stacked in a direction that substantially orthogonal to the planar structure.

Clause 13: The method according to any of clauses 10 to 12, wherein each substrate in the substrate stack comprises a plurality of alignment opening sets; and each alignment opening set of each substrate in the substrate stack is configured such that, for each one of the substrates in the substrate stack, there is at least one light beam path through the alignment opening sets that is indicative of the position of said one substrate relative to the other substrates.

Clause 14: The method according to any of clause 13, wherein the configuration of alignment openings in each alignment opening set is substantially the same.

Clause 15: The method according to any of clauses 13 or 14, wherein the alignment openings in each alignment opening set are configured such that the alignment openings make a pattern that includes a substantially straight line.

Clause 16: The method according to any of clauses 13 or 14, wherein the alignment openings in each alignment opening set are configured such that the alignment openings make a pattern that includes a plurality of substantially straight lines.

Clause 17: The method according to any of clauses 13 or 14, wherein the alignment openings in each alignment opening set are configured such that the alignment openings make a pattern that includes two substantially straight lines that intersect each other substantially orthogonally.

Clause 18: The method according to any of clauses 10 to 17, wherein the substrate stack comprises an array of beam manipulators; and each beam manipulator in the array is configured to manipulate a sub-beam of a multi-beam of charged particles.

Clause 19: The method according to clause 18, wherein one or more of the substrates comprises at least part of one or more beam manipulators in the array of beam manipulators.

Clause 20: The method according to clause 18 or 19, wherein the array of beam manipulators is an N by M array; N is between 2 and 20, such as 5; and M is between 2 and 20, such as 5.

Clause 21: The method according to any of clauses 13 to 20, wherein: each substrate comprises at least first and second alignment opening sets; each alignment opening set on a substrate is on a different part of the substrate to the array of beam manipulators; and the array of beam manipulators is arranged between the first alignment opening set and the second alignment opening set.

Clause 22: The method according to clause 21, wherein the first and second alignment openings of each substrate are located at opposite ends of a major surface of the substrate.

Clause 23: The method of clause 21 or 22, wherein the arrangement of the alignment openings in the first alignment opening set has mirror symmetry with the arrangement of the alignment openings in the second alignment opening set.

Clause 24: The method according to any of clauses 10 to 23, further comprising: illuminating the alignment openings on the substrate stack of substrates such that a plurality of light beams travel through the substrate stack; obtaining data indicative of the light beam locations; determining the relative alignment of substrates in the substrate stack in dependence on the data indicative of the light beam locations.

Clause 25: The method according to clause 24, further comprising generating one or more images that indicate the relative positions of the plurality of light beams in dependence on the data indicative of the light beam locations.

Clause 26: The method according to clause 24 or 25, wherein the data indicative of the light beam locations is obtained by a light detector, and the method further comprises processing the data indicative of the light beam locations so as to compensate for any tilt between the substrate stack and an optical axis of the light detector.

Clause 27: The method according to any of clauses 10 to 26, further comprising determining if the alignment of substrates within the substrate stack meets a performance specification in dependence on the determined x, y, and Rz alignment of the substrates.

Clause 28: A computing system configured to determine the alignment of substrates in a substrate stack by performing the method according to any of clauses 10 to 27.

Clause 29: A tool for obtaining data indicative of light beam locations, the tool comprising: a stack holder configured to hold a substrate stack according to any of clauses 1 to 9; an illuminator configured to illuminate at least part of a surface of the substrate stack; and a light detector configured to generate data indicative of the light beam locations in dependence on a plurality of light beams that have passed through the substrate stack.

Clause 30: A system comprising the tool according to clause 29 and the computing system according to clause 28.

Clause 31: A method for determining the alignment of substrates in a substrate stack, the substrate stack having at least two substrates, wherein in each of the substrates there are a plurality of alignment openings that align with corresponding alignment openings in the other substrates of the substrate stack such that there is a through passage through the substrate stack associated with each alignment opening in each substrate, the method comprising: determining the relative positions of a plurality of light beams, each light beam having passed along a light path through the substrate stack via a respective through passage; and determining the relative x, y, and Rz alignments of the substrates in the substrate stack in dependence on the determined positions; wherein: the alignment opening of one of the substrates that defines the through passage for a corresponding light path through the through passage has a smaller diameter than the other alignment openings that define the through passage; and for each light path a different substrate in the substrate stack has an diameter with a smaller diameter than the other alignment openings that define the corresponding through passage in the substrate stack.

Clause 32: The method according to clause 31, wherein the light paths are configured such that: each light path has a position indicative of one substrate in the substrate stack relative to the other substrate in the substrate stack, and/or the relative positions of the light paths are indicative of the x, y, and Rz alignments of the substrates in the substrate stack.

Clause 33: A substrate stack of substrates comprising beam manipulators, the substrate stack having at least two substrates, wherein in each substrate there are a plurality of alignment openings that align with corresponding alignment openings in the other substrates of the substrate stack such that there is a through passage through the substrate stack associated with each alignment opening in each substrate, wherein each of the plurality of through passages is for the passage of a light beam and the light beams are suitable for determining the relative x, y, and Rz alignments of the substrates in the substrate stack; wherein: the alignment opening of one of the substrates, that defines the through passage for a corresponding light path through the through passage, has a smaller diameter than the other alignment openings that define the through passage; and a different substrate in the substrate stack has an alignment opening with a smaller diameter than the other alignment openings that define the corresponding through passage in the substrate stack.

Clause 34: The substrate stack of substrates according to clause 33, each through passage is for passage of a different light path; each light path has a position indicative of one substrate in the substrate stack relative to the other substrates in the substrate stack; and/or the relative positions of the light paths are indicative of the x, y, and Rz alignments of the substrates in the substrate stack.

Clause 35: A combination of a printed circuit board, PCB, and the substrate stack of clause 33 or 34, the substrate stack being provided on the PCB, wherein in the PCB is defined an opening configured to be aligned with the through passage in the substrate stack for interacting with a stack light source; and a surface of the PCB comprises a plurality of alignment structures configured to interact with a PCB light source.

Clause 36: The combination of clause 35, wherein the PCB and the substrate stack are configured so that interaction of the stack light source with the through passage in the substrate stack and the corresponding opening in the PCB and the interaction of the PCB light source with the plurality of alignment structures enables the relative x, y, and Rz alignments of the substrate stack and the PCB to be determined.

Clause 37: A combination of a printed circuit board, PCB, and substrate stack in which is defined a plurality of through passages for beam path openings, the substrate stack being provided on the PCB, wherein in a surface of the PCB is a plurality of alignment structures configured to interact with a light source for enabling the alignment of the PCB to be determined.

Clause 38: A method for determining the relative alignments of a substrate stack and a printed circuit board, PCB, wherein the substrate stack is provided on the PCB, the method comprising: determining the positions of a first plurality of light beams that have passed through both a respective plurality of openings through the substrate stack and at least one opening in the PCB; determining the positions of a second plurality of light beams that are dependent on a plurality of PCB alignment structures; and determining the relative x, y, and Rz alignments of the substrate stack and the PCB in dependence on the determined positions of the first and second plurality of light beams.

Clause 39: The method according to clause 38, wherein the PCB alignment structures comprise markers on the PCB that are configured to reflect at least some of the second plurality of light beams; wherein the positions of the second plurality of light beams are determined after the second plurality of light beams have been reflected off a respective plurality of markers on the PCB.

Clause 40: The method according to clause 39, wherein the PCB alignment structures comprise one or more alignment openings in the PCB; wherein the positions of the second plurality of light beams are determined after the second plurality of light beams has passed through a respective plurality of alignment openings through the PCB.

Clause 41: The method according to any of clauses 38 to 40, wherein none of the second plurality of light beams passes through the substrate stack.

Clause 42: The method according to any of clauses 38 to 41, further comprising: illuminating the PCB and the substrate stack; obtaining data that indicates the positions of the first and second plurality of light beams; and determining the relative x, y, and Rz alignments of the substrate stack and the PCB in dependence on the obtained data that indicates the positions of the first and second plurality of light beams.

Clause 43: The method according to any of clauses 38 to 41, wherein the one more images are generated by a light detector, and the method further comprises processing data that indicates the positions of the first and second plurality of light beams so as to compensate for any tilt between the substrate stack and an optical axis of the light detector.

Clause 44: The method according to any of clauses 38 to 41, further comprising determining if the relative alignment of the PCB and substrate stack meets a performance specification in dependence on the determined x, y, and Rz alignments.

Clause 45: A computing system configured to determine the alignment of a PCB and a substrate stack by performing the method according to any of clauses 38 to 44.

The descriptions above are intended to be illustrative, not limiting. Thus, it will be apparent to one skilled in the art that modifications may be made as described without departing from the scope of the claims set out below and clauses provided above.

The invention claimed is:

1. A substrate stack comprising a plurality of substrates, wherein:
   each substrate in the substrate stack comprises at least one alignment opening set;
   the at least one alignment opening set in each substrate is aligned for a light beam to pass through corresponding alignment openings in each substrate; and
   each substrate comprises at least one alignment opening that has a smaller diameter than the corresponding alignment openings in the other substrates.

2. The substrate stack according to claim 1, wherein each substrate in the substrate stack comprises a plurality of alignment opening sets; and
   each alignment opening set of each substrate in the substrate stack is configured such that, for each one of the substrates in the substrate stack, there is at least one light beam path through the alignment opening sets that is indicative of a position of said one substrate relative to the other substrates.

3. The substrate stack according to claim 1, wherein the alignment openings in each alignment opening set are configured such that the alignment openings make a pattern that includes: a substantially straight line; a plurality of substantially straight lines or two substantially straight lines that intersect each other substantially orthogonally.

4. The substrate stack according to claim 1, wherein the substrate stack comprises an array of beam manipulators; and
   each beam manipulator in the array is configured to manipulate a sub-beam of a multi-beam of charged particles.

5. The substrate stack according to claim 4, wherein the array of beam manipulators is an N by M array;
   N is between 2 and 20, such as 5; and
   M is between 2 and 20, such as 5.

6. The substrate stack according to claim 1, wherein:
   each substrate comprises at least first and second alignment opening sets;
   each alignment opening set on a substrate is on a different part of the substrate to an array of beam manipulators; and
   the array of beam manipulators is arranged between the first alignment opening set and the second alignment opening set.

7. The substrate stack according to claim 6, wherein the first and second alignment opening sets of each substrate are located at opposite ends of a major surface of the substrate.

8. A method for determining the alignment of substrates in a substrate stack that comprises a plurality of substrates, the method comprising:
   determining positions of a plurality of light beams that have passed through a respective plurality of alignment openings defined in each substrate in the substrate stack; and
   determining relative x, y, and Rz alignments of at least two substrates in the substrate stack in dependence on the determined positions;
   wherein:
      for each light beam path through the substrate stack, the alignment opening of one of the substrates on the light beam path has a smaller diameter than all of one or more other alignment openings of respective one or more other substrates on the light beam path; and
      for each one of at least two of the plurality of light beam paths, a different one of the substrates on the light beam path has an alignment opening with a smaller diameter than all of one or more other alignment openings of respective one or more other substrates on the light beam path such that, for each one of at least two substrates in the substrate stack, there are one or more light beams paths with positions that are indicative of the position of only said one substrate.

9. The method according to claim 8, wherein the alignment opening diameters in all of the substrates are configured such that, for each one of the substrates, the positions of one or more light beam paths are dependent on only said one substrate.

10. The method according to claim 8, wherein each substrate in the substrate stack has a substantially planar structure; and the substrates in the substrate stack are stacked in a direction that substantially orthogonal to the planar structure.

11. The method according to claim 8, wherein each substrate in the substrate stack comprises a plurality of alignment opening sets; and each alignment opening set of each substrate in the substrate stack is configured such that, for each one of the substrates in the substrate stack, there is at least one light beam path through the alignment opening sets that is indicative of the position of said one substrate relative to the other substrates.

12. The method according to claim 11, wherein the alignment openings in each alignment opening set are configured such that the alignment openings make a pattern that includes: a substantially straight line; a plurality of substantially straight lines; or two substantially straight lines that intersect each other substantially orthogonally.

13. The method according to claim 8, wherein the substrate stack comprises an array of beam manipulators; and each beam manipulator in the array is configured to manipulate a sub-beam of a multi-beam of charged particles.

14. The method according to claim 11, wherein:
each substrate comprises at least first and second alignment opening sets;
each alignment opening set on a substrate is on a different part of the substrate to an array of beam manipulators; and
the array of beam manipulators is arranged between the first alignment opening set and the second alignment opening set.

15. The method according to claim 14, wherein the first and second alignment openings of each substrate are located at opposite ends of a major surface of the substrate.

16. The method of claim 14, wherein the arrangement of the alignment openings in the first alignment opening set has mirror symmetry with the arrangement of the alignment openings in the second alignment opening set.

17. A substrate stack of substrates comprising beam manipulators, the substrate stack having at least two substrates, wherein in each substrate there are a plurality of alignment openings that align with corresponding alignment openings in the other substrates of the substrate stack such that there is a through passage through the substrate stack associated with each alignment opening in each substrate, wherein each of the plurality of through passages is for the passage of a light beam and the light beams are suitable for determining relative x, y, and Rz alignments of the substrates in the substrate stack; wherein:
the alignment opening of one of the substrates, that defines the through passage for a corresponding light path through the through passage, has a smaller diameter than the other alignment openings that define the through passage; and
a different substrate in the substrate stack has an alignment opening with a smaller diameter than the other alignment openings that define the corresponding through passage in the substrate stack.

18. The substrate stack of substrates according to claim 17, each through passage is for passage of a different light path.

19. The substrate stack of substrates according to claim 18, wherein each light path has a position indicative of one substrate in the substrate stack relative to the other substrates in the substrate stack.

20. The substrate stack of substrates according to claim 18, wherein relative positions of the light paths are indicative of the relative x, y, and Rz alignments of the substrates in the substrate stack.

\* \* \* \* \*